(12) United States Patent
Lin et al.

(10) Patent No.: US 12,446,292 B2
(45) Date of Patent: Oct. 14, 2025

(54) SEMICONDUCTOR DEVICE AND METHODS OF FORMATION

(71) Applicant: Taiwan Semiconductor Manufacturing Company, Ltd., Hsinchu (TW)

(72) Inventors: Keng-Wei Lin, New Taipei (TW); Chia-Chi Yu, New Taipei (TW); Chun-Lung Ni, Tainan (TW); Jui Fu Hsieh, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 919 days.

(21) Appl. No.: 17/650,553

(22) Filed: Feb. 10, 2022

(65) Prior Publication Data

US 2023/0253253 A1 Aug. 10, 2023

(51) Int. Cl.
*H01L 21/32* (2006.01)
*H01L 21/3213* (2006.01)
*H01L 21/762* (2006.01)
*H10D 30/01* (2025.01)
*H10D 30/62* (2025.01)
*H10D 64/01* (2025.01)
*H10D 84/01* (2025.01)
*H10D 84/03* (2025.01)

(52) U.S. Cl.
CPC ..... *H10D 84/038* (2025.01); *H01L 21/32137* (2013.01); *H01L 21/762* (2013.01); *H10D 30/024* (2025.01); *H10D 30/6211* (2025.01); *H10D 64/017* (2025.01); *H10D 84/013* (2025.01); *H10D 84/0158* (2025.01)

(58) Field of Classification Search
None
See application file for complete search history.

(56) References Cited

U.S. PATENT DOCUMENTS

2017/0222020 A1* 8/2017 Yu .............. H10D 84/0151
2020/0006557 A1* 1/2020 Ko .............. H10D 30/024

* cited by examiner

*Primary Examiner* — Steven B Gauthier
*Assistant Examiner* — Lamont B Koo
(74) *Attorney, Agent, or Firm* — Harrity & Harrity, LLP

(57) ABSTRACT

A two-step etch technique is used in a continuous polysilicon on oxide definition edge (CPODE) recess process to form a recess in which the CPODE structure is to be formed. The two-step process includes performing a first etch operation using an isotropic etch technique, in which a recess in a dummy gate structure is formed to a first depth. A second etch operation is performed using anisotropic etch technique to form the recess to a second depth. The use of the anisotropic etch technique results in a highly directional (e.g., vertical) etch of the dummy gate structure in the second etch operation. The highly directional etch provided by the anisotropic etch technique at or near the bottom of the dummy gate structure reduces, minimizes, and/or prevents etching into adjacent portions of an interlayer dielectric (ILD) layer and/or into source/drain region(s) under the portions of the ILD layer.

20 Claims, 28 Drawing Sheets

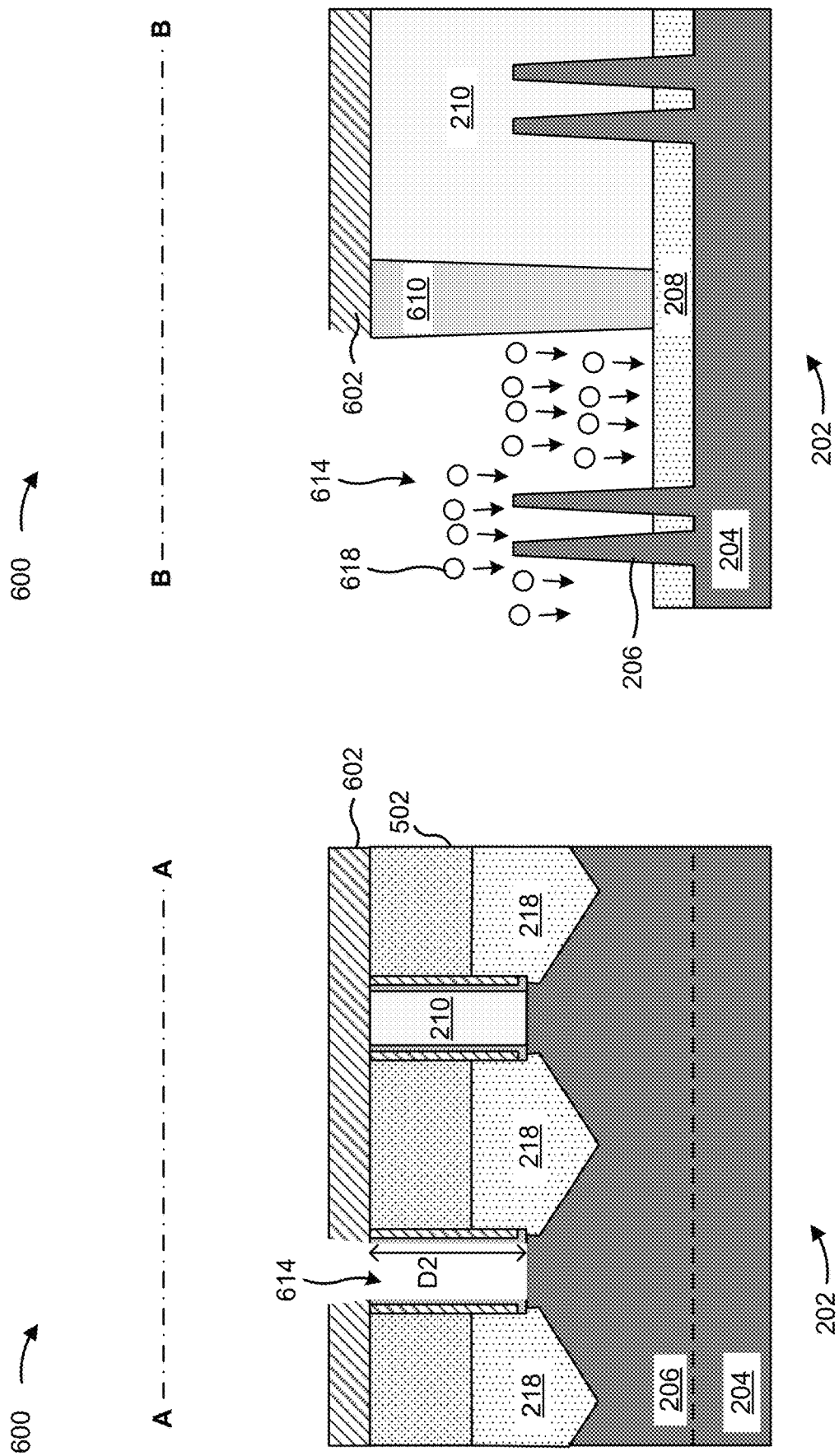

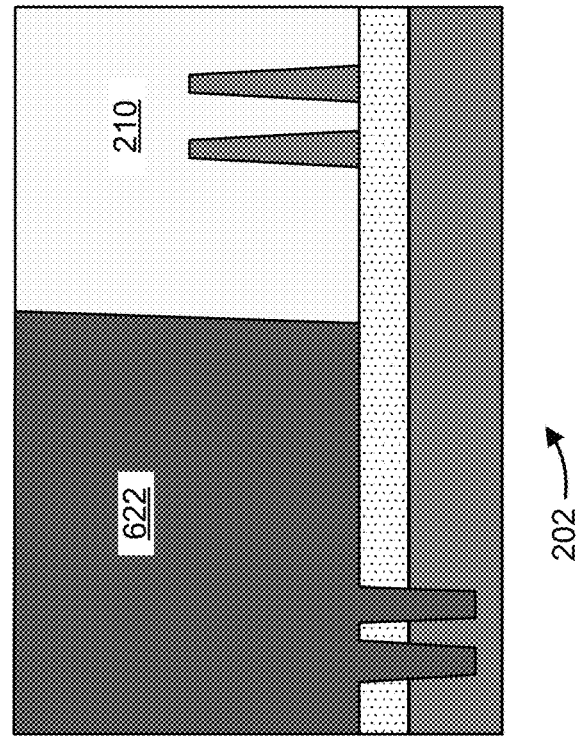
FIG. 6M
FIG. 6N

SEMICONDUCTOR DEVICE AND METHODS OF FORMATION

BACKGROUND

Fin-based transistors, such as fin field effect transistors (finFETs) and nanostructure transistors (e.g., nanowire transistors, nanosheet transistors, gate-all-around (GAA) transistors, multi-bridge channel transistors, nanoribbon transistors), are three-dimensional structures that include a channel region in a fin (or a portion thereof) that extends above a semiconductor substrate as a three-dimensional structure. A gate structure, configured to control a flow of charge carriers within the channel region, wraps around the fin of semiconductor material. As an example, in a finFET, the gate structure wraps around three sides of the fin (and thus the channel region), thereby enabling increased control over the channel region (and therefore switching of the finFET). As another example, in a nanostructure transistor, the gate structure wraps around a plurality of channel regions in a fin structure such that the gate structure surrounds each of the plurality of channel regions. Source/drain regions (e.g., epitaxial regions) are located on opposing sides of the gate structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
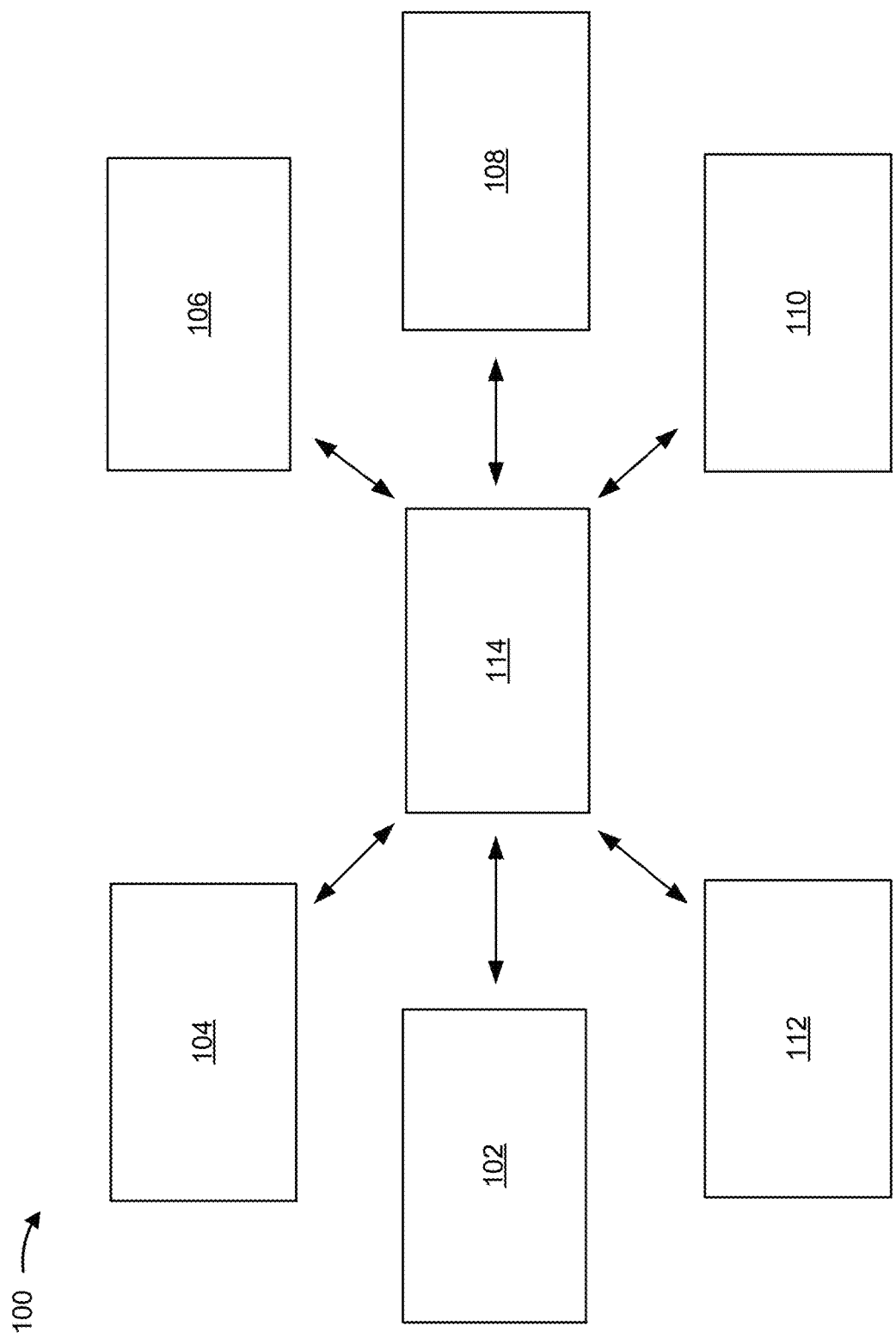
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A continuous polysilicon on oxide definition edge (CPODE) process may be performed to remove a portion of a polysilicon dummy gate structure, and replace the portion of the polysilicon dummy gate structure with a CPODE structure. The CPODE structure includes an insulating structure that is formed in a recess after removal of the portion of the polysilicon dummy gate structure. The CPODE structure extends into a silicon fin and into a portion of the underlying substrate. The CPODE structure is formed to provide isolation (e.g., electrical isolation and/or physical isolation between regions of a semiconductor device, such as between device regions of the semiconductor device, between active regions of the semiconductor device, and/or between memory cells of the semiconductor device, among other examples).

In some cases, damage can occur to a source/drain region during one or more of the etching operations in the CPODE process. When removing a portion of a polysilicon dummy gate structure to form a recess in which a CPODE structure is to be formed, weak points in spacers (e.g., gate spacers) at the bottom of an interlayer dielectric (ILD) layer adjacent to the polysilicon dummy gate can be susceptible to isotropic etching. This can cause the spacers to be etched through at the weak points, which can lead to etching into the ILD layer and etching of the source/drain region(s) under the ILD layer. As a result, source/drain region damage can occur, which can reduce semiconductor device yield and decreased semiconductor device performance.

Some implementations described herein provide techniques for forming a CPODE structure in a manner in which damage to adjacent portions of an ILD layer and/or damage to underlying source/drain regions is reduced, minimized, and/or prevented. In some implementations, a two-step etch technique is used in a CPODE recess process to form a recess in which the CPODE structure is to be formed. The two-step process includes performing a first etch operation using an isotropic etch technique, in which a recess in a dummy gate structure is formed to a first depth. Then, a second etch operation is performed using anisotropic etch technique to form the recess to a second depth. The use of the anisotropic etch technique results in a highly directional (e.g., vertical) etch of the dummy gate structure in the second etch operation. The anisotropic etch technique is used to etch the recess at or near the bottom of the dummy gate structure where gate spacers along the dummy gate structure might be weak or non-existent. The highly directional etch provided by the anisotropic etch technique at or near the bottom of the dummy gate structure reduces, minimizes, and/or prevents etching into the adjacent portions of the ILD layer and/or into the source/drain region(s) under the portions of the ILD layer because lateral etching is reduced, minimized, and/or prevented using the anisotropic etch technique. Accordingly, the techniques described herein may increase semiconductor device yield, increase semiconductor device performance, and/or reduce the likelihood of damage to the semiconductor device caused by etching. Moreover, the combination of isotropic etching and anisotropic etching enables the recess to be quickly formed (e.g., by using a relatively fast etch technique such as isotropic etching to etch the recess to an initial depth) while (e.g., by using anisotropic etching to etch the remaining depth of the recess) reducing, minimizing, and/or preventing etching damage in the CPODE recess process.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the environment 100 includes a plurality of wafer/die transport tools 114.

The wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
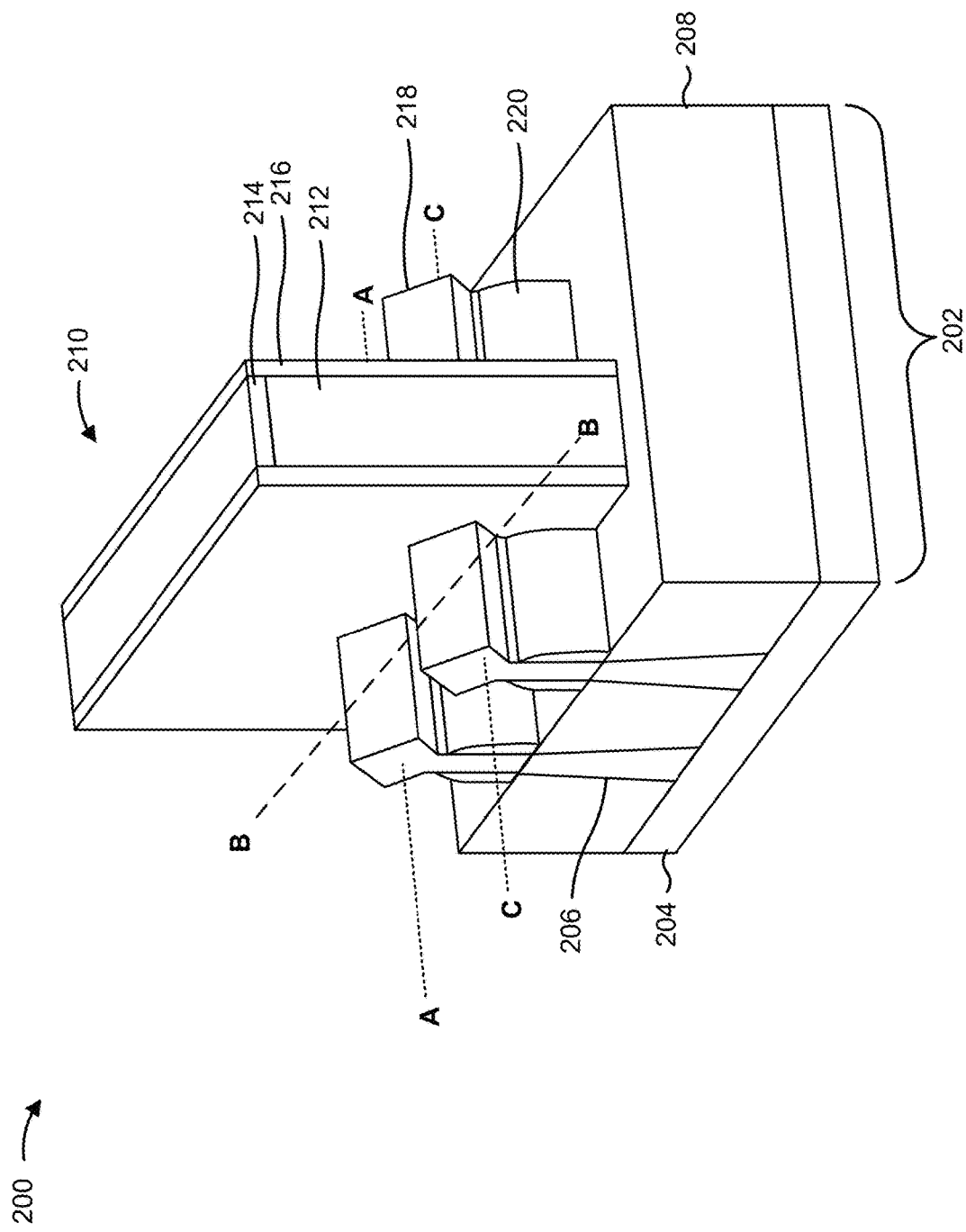
FIG. 2 is a diagram of a region of an example semiconductor device described herein.

FIG. 2 is a diagram of example regions of a semiconductor device 200 described herein. In particular, FIG. 2 illustrates an example device region 202 of the semiconductor device 200 in which one or more transistors or other devices are included. The transistors may include fin-based transistors, such as fin field effect transistors (finFETs), nanostructure transistors, and/or other types of transistors. In some implementations, the device region 202 includes a p-type metal oxide semiconductor (PMOS) region, an n-type metal oxide semiconductor (NMOS) region, a complementary metal oxide semiconductor (CMOS) region, and/or another type of device region. FIGS. 3A-8C are schematic cross-sectional views of various portions of the device region 202 of the semiconductor device 200 illustrated in FIG. 2, and correspond to various processing stages of forming fin-based transistors in the device region 202 of the semiconductor device 200.

The semiconductor device 200 includes a substrate 204. The substrate 204 includes a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, or another type of semiconductor substrate. The substrate 204 may include a round/circular substrate having an approximately 200 mm diameter, an approximately 300 mm diameter, or another diameter, such as 450 mm, among other examples. The substrate 204 may alternatively be any polygonal, square, rectangular, curved, or otherwise non-circular workpiece, such as a polygonal substrate.

Fin structures 206 are included above (and/or extend above) the substrate 204 for the device region 202. A fin structure 206 may provide an active region where one or more devices (e.g., fin-based transistors) are formed. In some implementations, the fin structures 206 include silicon (Si) materials or another elementary semiconductor material such as germanium (Ge). In some implementations, the fin structures 206 include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof. In some implementations, the fin structures 206 are doped using n-type and/or p-type dopants.

The fin structures 206 are fabricated by suitable semiconductor process techniques, such as masking, photolithography, and/or etch processes, among other examples. As an example, the fin structures 206 may be formed by etching a portion of the substrate 204 away to form recesses in the substrate 204. The recesses may then be filled with isolating material that is recessed or etched back to form shallow trench isolation (STI) regions 208 above the substrate 204 and between the fin structures 206. Other fabrication techniques for the STI regions 208 and/or for the fin structures 206 may be used. The STI regions 208 may electrically isolate adjacent active areas in the fin structures 206. The STI regions 208 may include a dielectric material such as a silicon oxide ($SiO_x$), a silicon nitride ($Si_xN_y$), a silicon oxynitride (SiON), fluoride-doped silicate glass (FSG), a low-k dielectric material, and/or other suitable insulating material. The STI regions 208 may include a multi-layer structure, for example, having one or more liner layers.

A dummy gate structure 210 (or a plurality of dummy gate structures 210) is included in the device region 202 over the fin structures 206 (e.g., approximately perpendicular to the fin structures 206). The dummy gate structure 210 engages the fin structures 206 on three or more sides of the fin structures 206. In the example depicted in FIG. 2, the dummy gate structure 210 includes a polysilicon layer 212, one or more hard mask layers 214 over and/or on a top surface of the polysilicon layer 212, and/or one or more gate spacers 216 over and/or on sidewalls of the polysilicon layer 212. In some implementations, the dummy gate structure 210 further includes a capping layer, a gate dielectric layer, and/or another suitable layer. The various layers of the dummy gate structure 210 may be formed by suitable deposition techniques and patterned by suitable photolithography and etching techniques.

The term, "dummy", as described here, refers to a sacrificial structure which will be removed in a later stage and will be replaced with another structure, such as a high dielectric constant (high-k) dielectric and metal gate structure in a replacement gate process. The replacement gate process refers to manufacturing a gate structure at a later stage of the overall gate manufacturing process. Accordingly, the configuration of the semiconductor device 200 illustrated in FIG. 2 may include an intermediate configuration, and additional semiconductor processing operations may be performed for the semiconductor device 200 to further process the semiconductor device 200.

The polysilicon layer 212 may include a polysilicon material or another suitable material. The polysilicon layer 212 may be formed by suitable deposition processes such as LPCVD or PECVD, among other examples. The hard mask layer(s) 214 may include any material suitable to pattern the polysilicon layer 212 with particular features/dimensions on the substrate 204. The gate spacer(s) 216 are included on the sidewalls of the polysilicon layer 212 to provide electrical isolation and/or physical isolation between a replacement gate structure (e.g., that is to replace the polysilicon layer 212) and source/drain regions adjacent to the replacement gate structure. The gate spacer(s) 216 include a dielectric material such as an oxide or a nitride, and are configured to prevent gate-to-source/drain shorting and gate-to-source/drain leakage.

In some implementations, the dummy gate structures 210 include one or more additional layers, such as a gate dielectric layer among other examples. A gate dielectric layer may be included under a polysilicon layer 212 (e.g., between a polysilicon layer 212 and one or more fin structures 206, between a polysilicon layer 212 and one or more STI regions 208). The gate dielectric layer may include a dielectric oxide layer. The dielectric oxide layer may be formed by chemical oxidation, thermal oxidation, ALD, CVD, and/or other suitable methods.

In some implementations, the various layers of the dummy gate structure 210 are first deposited as blanket layers. Then, the blanket layers are patterned through a process including photolithography and etching processes, removing portions of the blanket layers and keeping the remaining portions over the STI regions 208 and the fin structures 206 to form the dummy gate structure 210.

Source/drain regions 218 are disposed over various regions of the fin structures 206 and adjacent to the dummy gate structure 210. Fin sidewall spacers 220 are included on opposing sides of the source/drain regions 218. Opposing source/drain regions 218 over a fin structure 206, along with a replacement gate structure that is formed in the place of the dummy gate structure 210, make up transistors (e.g., finFET transistors and/or other types of transistors) of the semiconductor device 200 in the device region 202. The source/drain regions 218 include silicon (Si) with one or more dopants, such as a p-type material (e.g., boron (B) or germanium (Ge), among other examples), an n-type material (e.g., phosphorous (P) or arsenic (As), among other examples), and/or another type of dopant. Accordingly, the device region 202 may include PMOS transistors that include p-type source/drain regions, NMOS transistors that include n-type source/drain regions, and/or other types of transistors.

As illustrated in FIG. 2, a fin structure 206 may be recessed in areas adjacent to the dummy gate structure 210 in which the source/drain regions 218 are formed. For example, a fin structure 206 may be recessed to a height that is approximately equal to, slightly less than, or slightly greater than a height of a top surface of STI regions 208 adjacent to the fin structure. Source/drain regions 218 are then formed on top of the recessed areas of the fin structure 206. While not visible in FIG. 2, it is noted that the fin structures 206 may not be recessed under the dummy gate structure 210 so that a replacement gate structure that replaces the dummy gate structure 210 can wrap around the three sides of the fin structures 206. Accordingly, the height of the portions of the fin structures 206 under the dummy gate structure 210 is greater than the height of the recessed portions of the fin structures 206 under the source/drain regions 218. The height of the portions of the fin structures 206 under the dummy gate structures 210 may be less than the heights of the source/drain regions 218 to reduce and/or minimize the amount of area of the portions of the fin structures 206 under the dummy gate structures 210 that are not interfaced with the source/drain regions 218 (which might otherwise reduce the efficiency of the transistors in the device region 202).

Some source/drain regions 218 may be shared between various transistors in the device region 202. In some implementations, various ones of the source/drain regions may be connected or coupled together such that fin-based transistors in the device region 202 are implemented as two functional transistors. For example, if neighboring (e.g., as opposed to opposing) source/drain regions 218 are electrically connected, such as through coalescing the regions by epitaxial growth (e.g., neighboring source/drain regions, as opposed to on opposing sides of the dummy gate structure 210, being coalesced), two functional transistors may be implemented. Other configurations in other examples may implement other numbers of functional transistors.

FIG. 2 further illustrates reference cross-sections that are used in later figures, including FIGS. 3A-8C. Cross-section A-A is in a plane across one or more dummy gate structures 210 and along a channel in a fin structure 206 between and through an approximate center of opposing source/drain regions 218. Cross-section B-B is in a plane perpendicular to cross-section A-A, and is across one or more source/drain regions 218 over one or more fin structures 206. Cross-section C-C is in a plane along a similar direction as cross-section A-A (e.g., across one or more dummy gate structures 210), except that the cross-section C-C is through an outer portion (or near an edge of) of opposing source/drain regions 218. In particular, the cross-section C-C is through an outer portion of the opposing source/drain regions 218 that extend outward from a sidewall of a fin structure 206. Accordingly, the fin structure 206 is not included in the plane of the cross-section C-C. Subsequent figures refer to these reference cross-sections for clarity. In some figures, some reference numbers of components or features illustrated therein may be omitted to avoid obscuring other components or features for ease of depicting the figures.

As described herein, the semiconductor device 200 may include one or more CPODE structures. In some implementations, a CPODE structure is included in a device region 202 of the semiconductor device 200 to provide isolation (e.g., electrical isolation, physical isolation) between devices (e.g., transistors and/or other types of devices) in the device region 202 and/or between active regions in the device region 202. In some implementations, a CPODE structure is included between two or more device regions 202 of the semiconductor device 200 to provide isolation (e.g., electrical isolation, physical isolation) between devices (e.g., transistors and/or other types of devices) in different device regions 202 and/or between active regions in different device regions 202.

As indicated above, FIG. 2 is provided as an example. Other examples may differ from what is described with regard to FIG. 2.

Figure 3A:
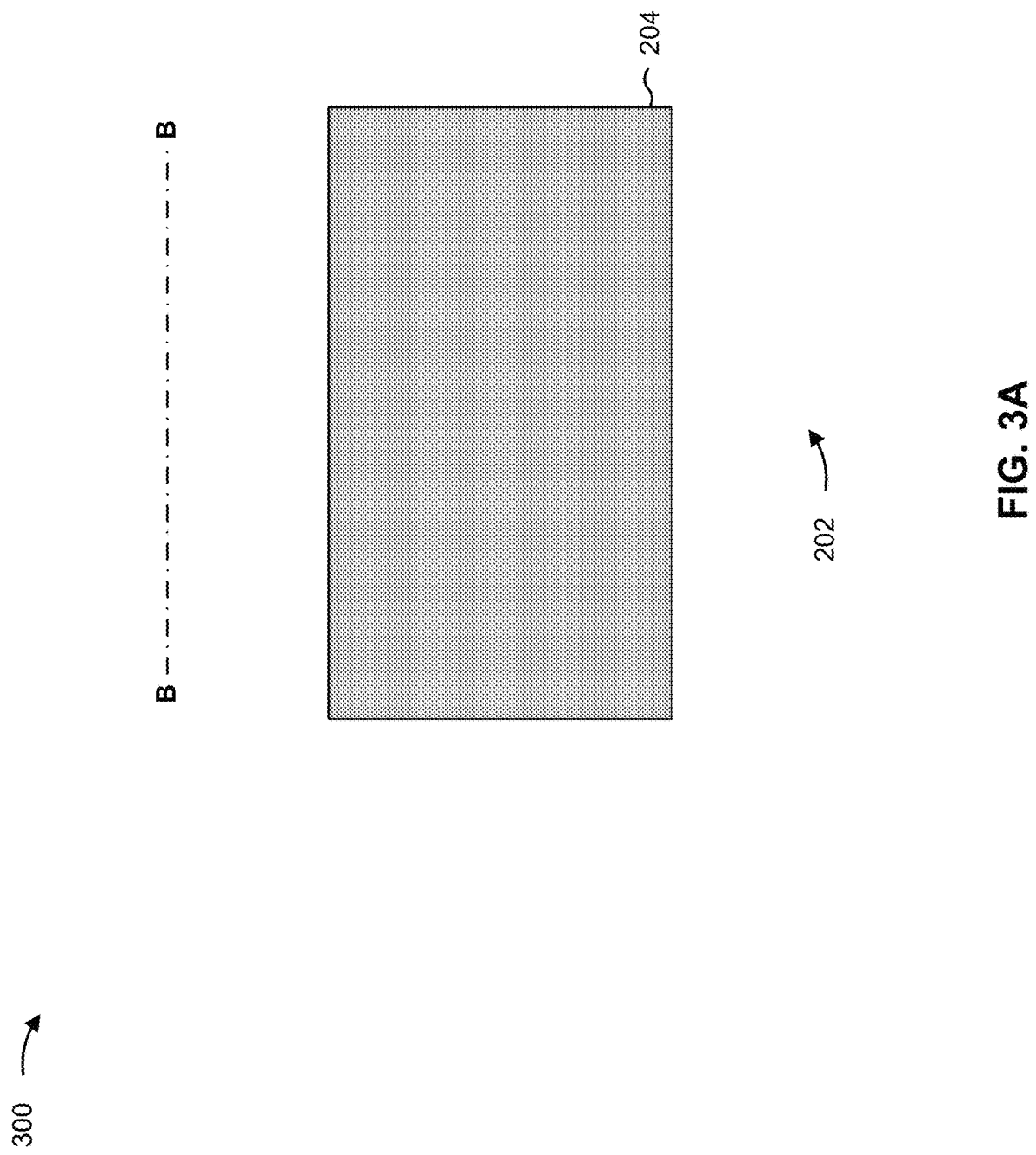
FIGS. 3A-3D, 4A-4C, and 5A-5C are diagrams of example implementations described herein.

FIGS. 3A-3D are diagrams of an example implementation 300 described herein. The example implementation 300 includes an example of forming fin structures 206 for transistors in the device region 202 of the semiconductor device 200. FIGS. 3A-3D are illustrated from the perspective of the cross-sectional plane B-B in FIG. 2 for the device region 202. Turning to FIG. 3A, the example implementation 300 includes semiconductor processing operations relating to the substrate 204 in and/or on which transistors are formed in the device region 202.

Figure 3B:
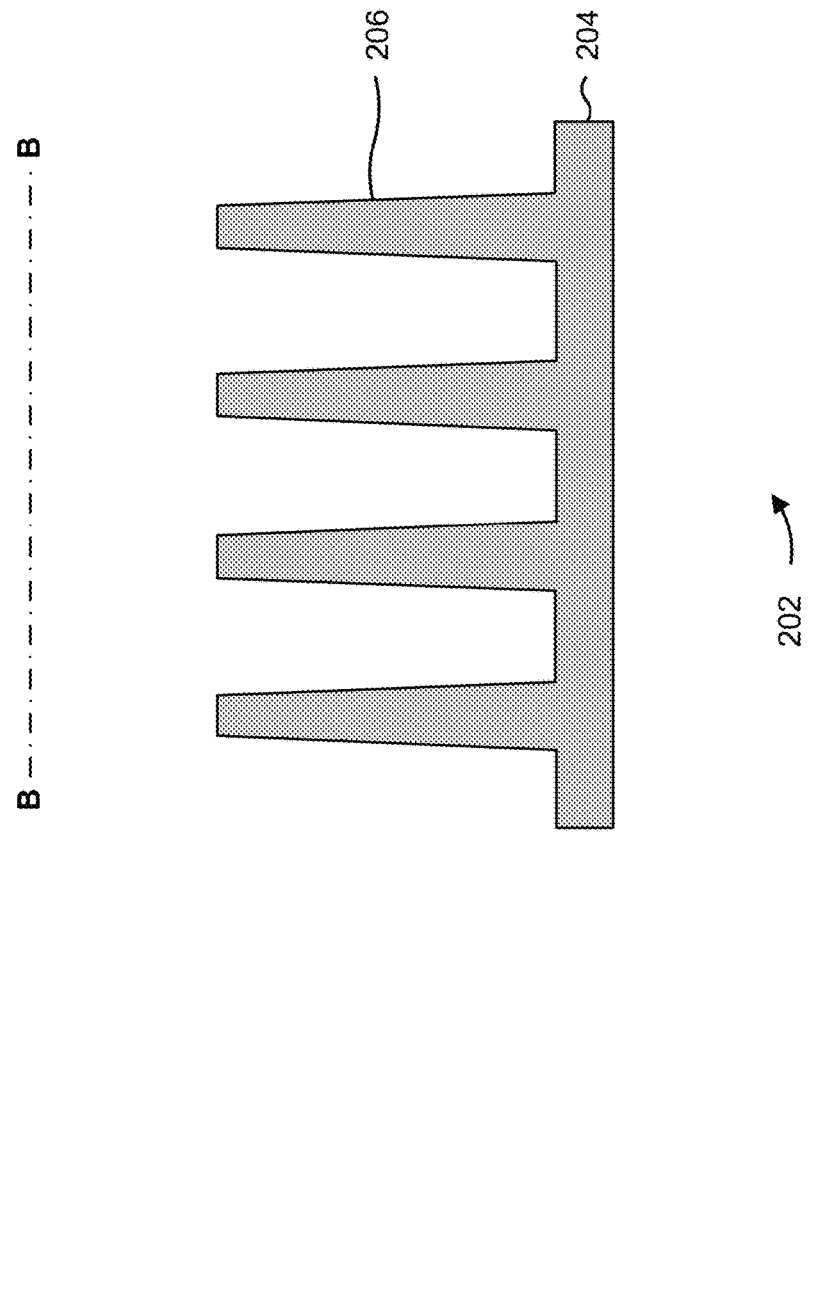

As shown in FIG. 3B, the fin structures 206 are formed in the substrate 204 in the device region 202. In some implementations, a pattern in a photoresist layer is used to form the fin structures 206. In these implementations, the deposition tool 102 forms the photoresist layer on the substrate 204. The exposure tool 104 exposes the photoresist layer to a radiation source to pattern the photoresist layer. The developer tool 106 develops and removes portions of the photoresist layer to expose the pattern. The etch tool 108 etches into the substrate 204 to form the fin structures 206. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the fin structures 206 based on a pattern.

Figure 3C:
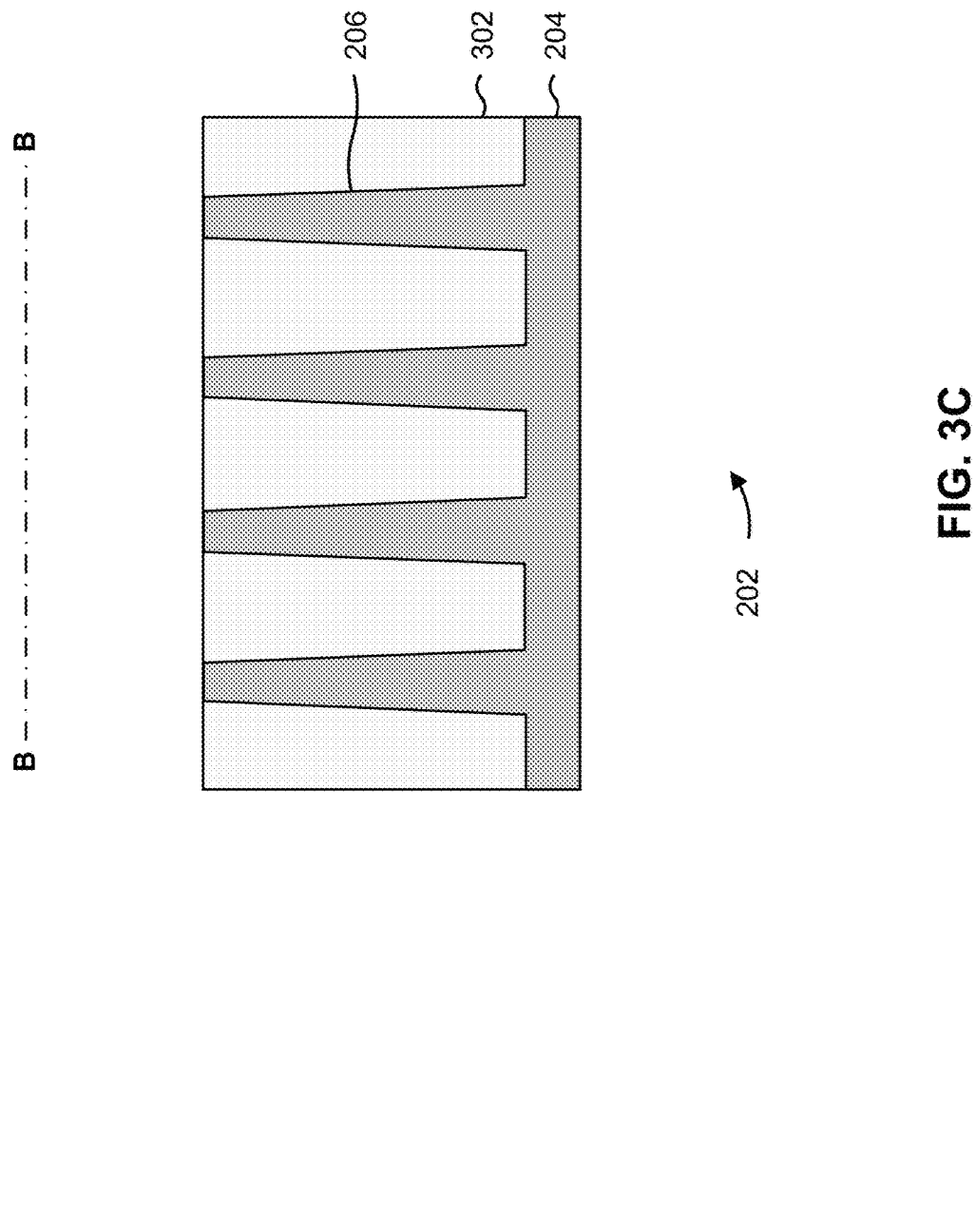

As shown in FIG. 3C, an STI layer 302 is formed in between the fin structures 206. The deposition tool 102 deposits the STI layer 302 using a CVD technique, a PVD technique, an ALD technique, a deposition technique described above in connection with FIG. 1, and/or another deposition technique. In some implementations, the STI layer 302 is formed to a height that is greater than the height of the fin structures 206. In these implementations, the planarization tool 110 performs a planarization (or polishing) operation to planarize the STI layer 302 such that the top surface of the STI layer 302 is substantially flat and smooth, and such that the top surface of the STI layer 302 and the top surface of the fin structures 206 are approximately the same height. The planarization operation may increase uniformity in the STI regions 208 that are formed from the STI layer 302 in a subsequent etch-back operation.

Figure 3D:
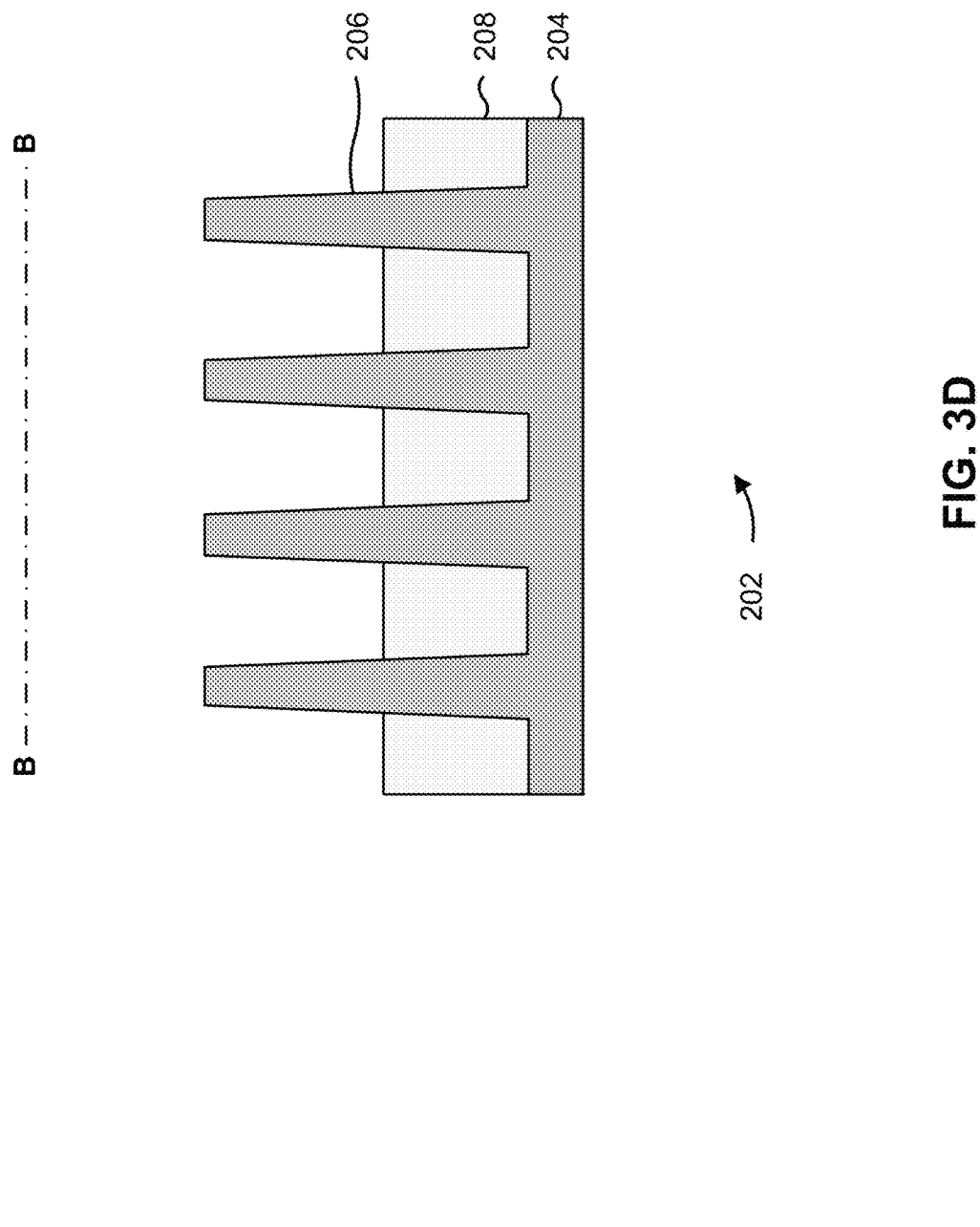

As shown in FIG. 3D, the STI layer 302 is etched in an etch back operation to expose portions of the fin structures 206. The etch tool 108 etches a portion of the STI layer 302 using a plasma etch technique, a wet chemical etch technique, and/or another type of etch technique. The remaining portions of the STI layer 302 between the fin structures 206 include the STI regions 208. In some implementations, the STI layer 302 is etched such that the height of the exposed portions of the fin structures 206 (e.g., the portions of the fin structures 206 that are above the top surface of the STI regions 208) and the same height in the device region 202. In some implementations, a first portion of the STI layer 302 in the device region 202 is etched and a second portion of the STI layer 302 in the device region 202 is etched such that the height of exposed portions of a first subset of the fin structures 206 and the height of the exposed portions of a second subset of the fin structures 206 are different, which enables the fin heights to be tuned to achieve particular performance characteristics for the device region 202.

As indicated above, FIGS. 3A-3D are provided as an example. Other examples may differ from what is described with regard to FIGS. 3A-3D.

Figure 4A:
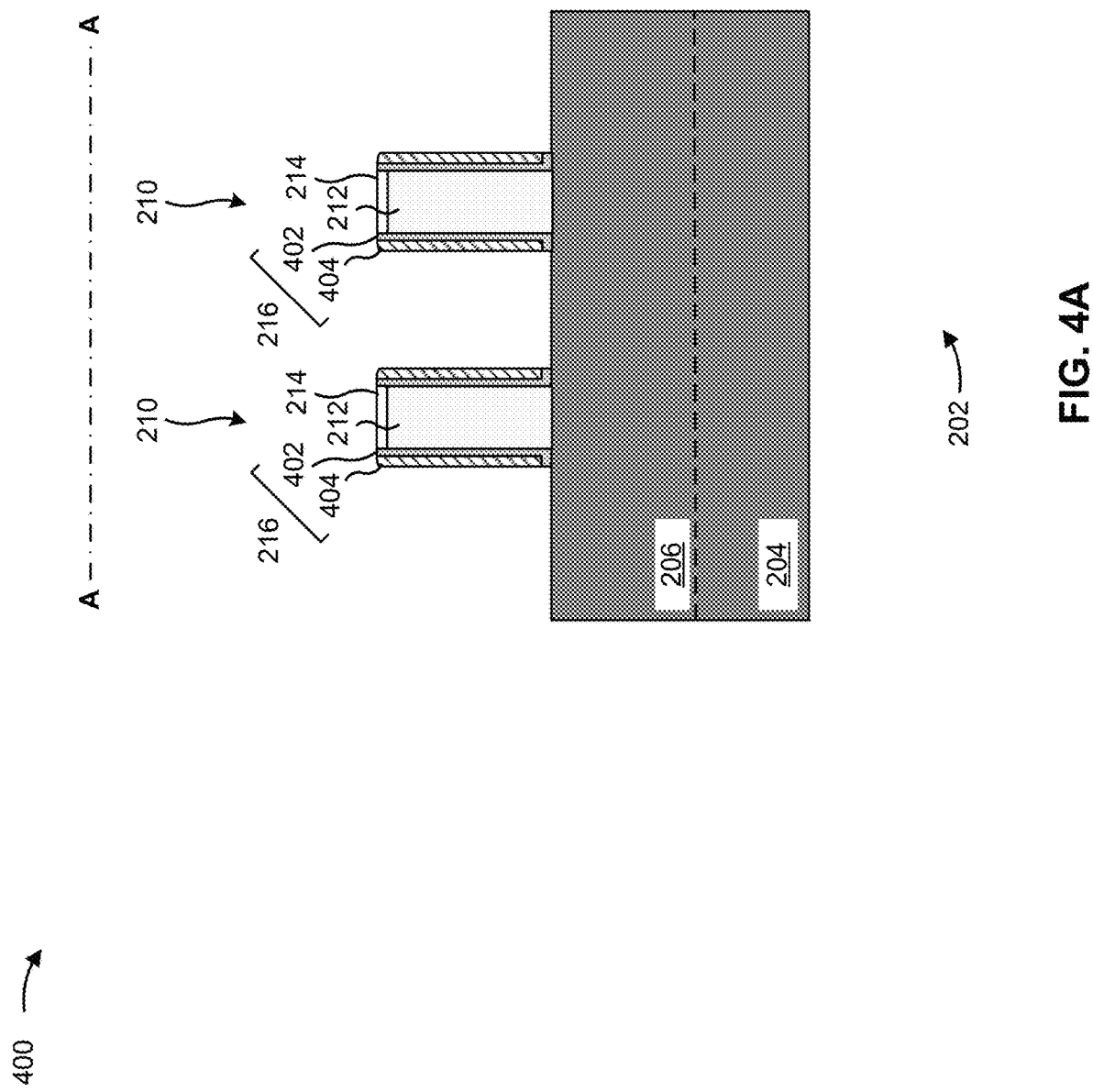
Figure 4B:
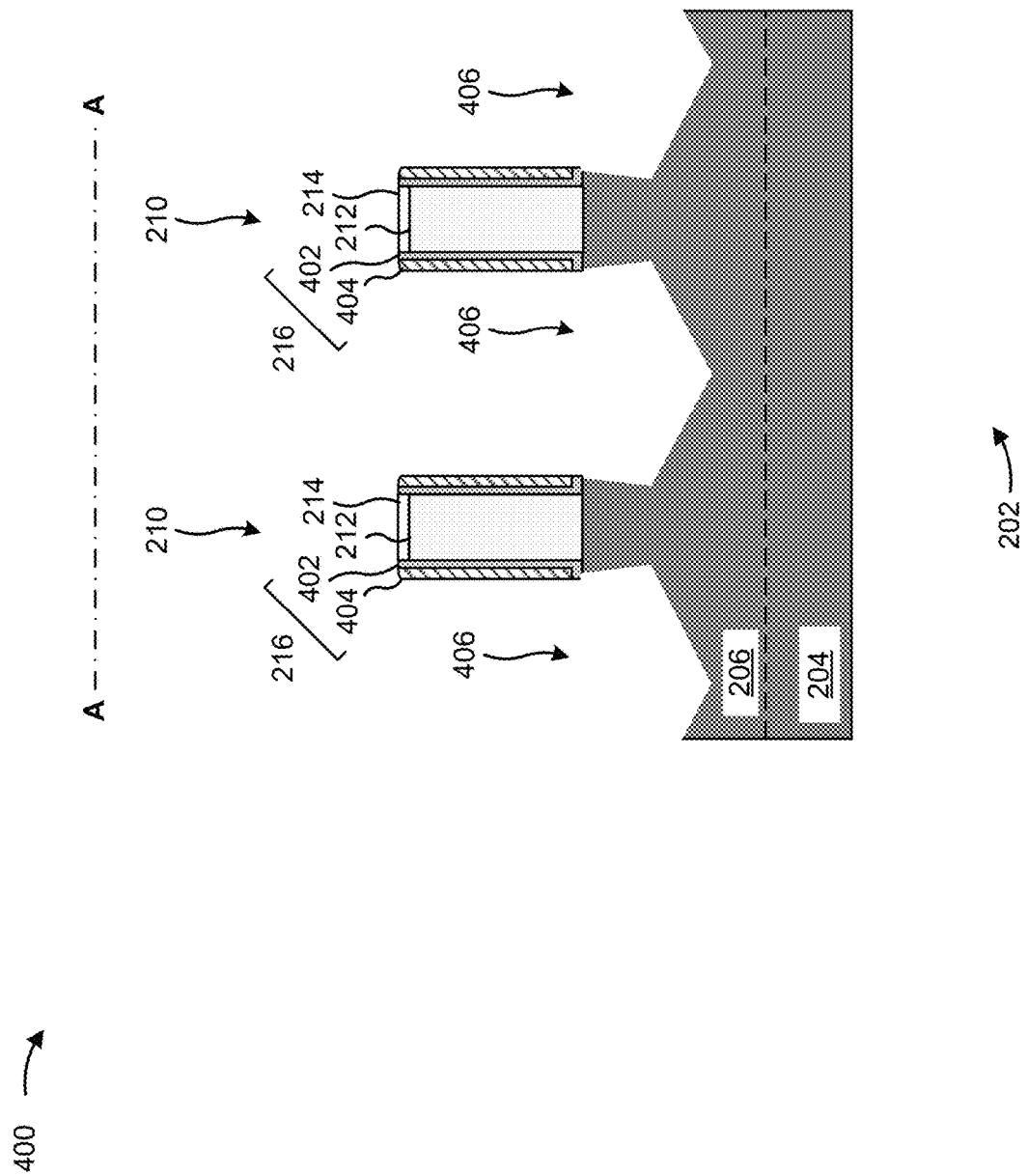
Figure 4C:
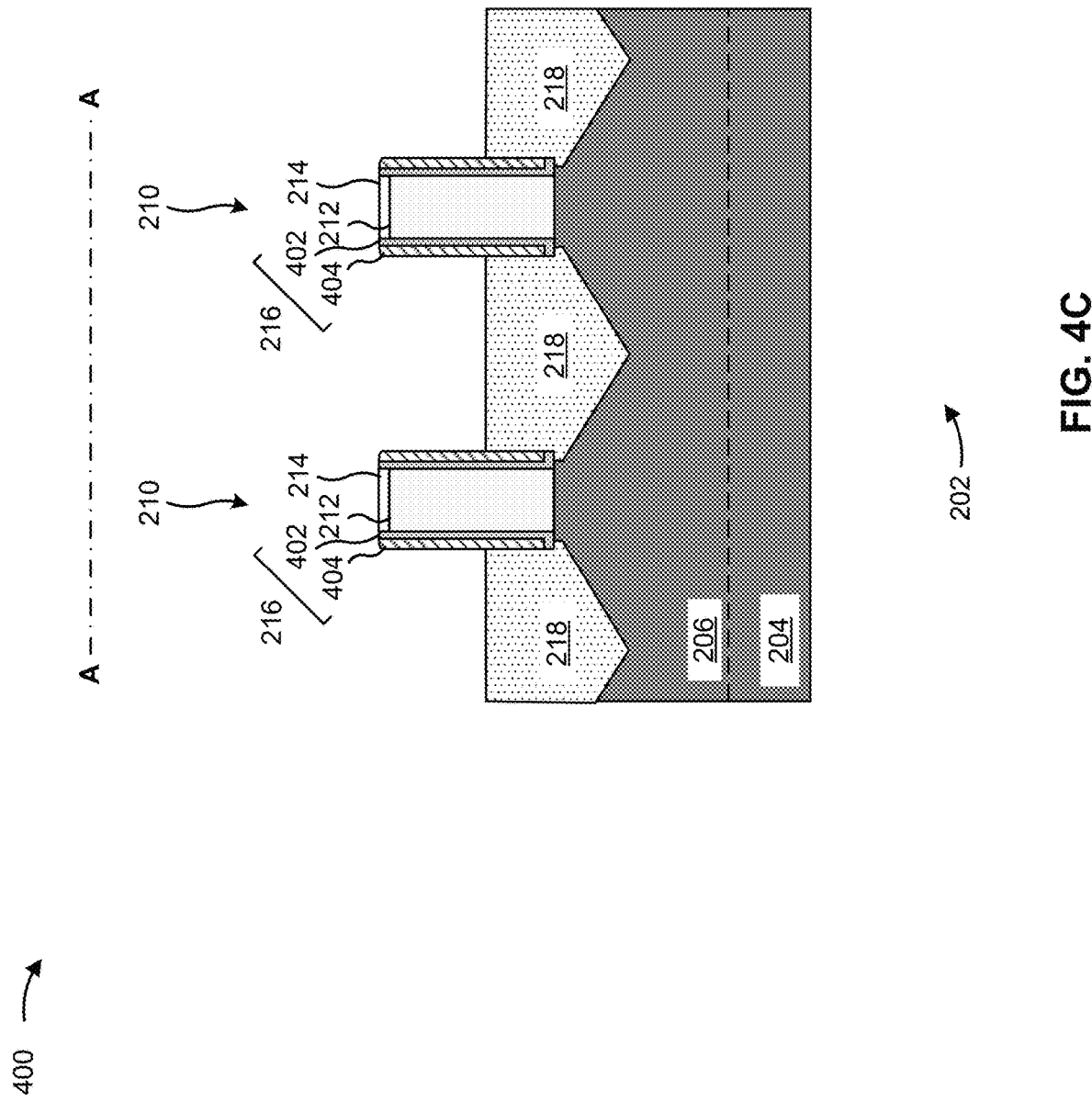

FIGS. 4A-4C are diagrams of an example implementation 400 described herein. The example implementation 400 includes an example of forming source/drain regions 218 of the device region 202 of the semiconductor device 200. FIGS. 4A-4C are illustrated from the perspective of the cross-sectional plane A-A in FIG. 2 for the device region 202. In some implementations, the operations described in connection with the example implementation 400 are performed after the fin formation process described in connection with FIGS. 3A-3D.

As shown in FIG. 4A, dummy gate structures 210 are formed in the device region 202. The dummy gate structures 210 are formed and included over the fin structures 206, and around the sides of the fin structures 206 such that the dummy gate structures 210 surround the fin structure 206 on at least three sides of the fin structure 206. The dummy gate structures 210 are formed as placeholders for the actual gate structures (e.g., replacement structures including high-k materials and metal materials) that are to be formed for the transistors included in the device region 202. The dummy gate structures 210 may be formed as part of a replacement gate process, which enables other layers and/or structures to be formed prior to formation of the replacement gate structures.

The dummy gate structures 210 include polysilicon layers 212, one or more hard mask layers 214, and one or more gate spacers 216. The polysilicon layers 212 may be formed (e.g., by the deposition tool 102) by suitable deposition processes such as LPCVD or PECVD, among other examples. The hard mask layer(s) 214 may each include any material suitable to pattern the polysilicon layers 212 with particular dimensions and/or attributes. Examples include silicon nitride, silicon oxynitride, silicon carbon nitride, or a combination thereof, among other examples. The hard mask layer(s) 214 may be deposited (e.g., by the deposition tool 102) by CVD, PVD, ALD, or another deposition technique.

As further shown in FIG. 4A, a gate spacer 216 may include a plurality of spacer layers, including a seal spacer layer 402 and a bulk spacer layer 404, among other examples. The seal spacer layers 402 are included on the sidewalls of the dummy gate structures 210 (e.g., on the sidewalls of the polysilicon layer 212). The seal spacer layers 402 may be conformally deposited (e.g., by the deposition tool 102) and may include a silicon oxycarbide (SiOC), a nitrogen free SiOC, or another suitable material. The seal spacer layers 402 may be formed by an ALD operation in which various types of precursor gasses including silicon (Si) and carbon (C) are sequentially supplied in a plurality of alternating cycles to form the seal spacer layers 402, among other example deposition techniques.

As further shown in FIG. 4A, bulk spacer layers 404 may be formed on the seal spacer layers 402. The bulk spacer layers 404 may be formed of similar materials as the seal spacer layers 402. However, the bulk spacer layers 404 may formed without plasma surface treatment that is used for the seal spacer layers 402. Moreover, the bulk spacer layers 404 may be formed to a greater thickness relative to the thickness of the seal spacer layers 402.

In some implementations, the seal spacer layers 402 and the bulk spacer layers 404 are conformally deposited (e.g., by the deposition tool 102) on the dummy gate structures 210, and on the fin structures 206. The seal spacer layers 402 and the bulk spacer layers 404 are then patterned (e.g., by the deposition tool 102, the exposure tool 104, and the developer tool 106) and etched (e.g., by the etch tool 108) to remove the seal spacer layers 402 and the bulk spacer layers 404 from the tops of the dummy gate structures 210 and from the fin structures 206.

In some implementations, the dummy gate structures 210 include one or more additional layers, such as a gate dielectric layer among other examples. A gate dielectric layer may be included under a polysilicon layer 212 of a dummy gate structure 210 (e.g., between a polysilicon layer 212 and one or more fin structures 206, between a polysilicon layer 212 and one or more STI regions 208). A gate dielectric may include one or more dielectric oxide layers. As an example, a gate dielectric layers may be formed (e.g., by the deposition tool 102) by chemical oxidation, thermal oxidation, ALD, CVD, and/or other suitable methods.

As shown in FIG. 4B, recesses 406 are formed in the fin structures 206 in the device region 202 between the dummy gate structures 210 in an etch operation. The etch operation may be referred to a first strained source/drain (SSD) etch operation, and the recesses 406 may be referred to as strained source/drain recesses. In some implementations, the first etch operation includes a plasma etch technique, a wet chemical etch technique, and/or another type of etch technique.

In some implementations, a plurality of etch operations are performed to form recesses 406 for different types of transistors. For example, a photoresist layer may be formed over and/or on a first subset of the fin structures 206 and over and/or on a first subset of the dummy gate structures 210 such that a second subset of the fin structures 206 between a second subset of the dummy gate structures 210 such that p-type source/drain regions and n-type source/drain regions may be formed in separate epitaxial operations.

As shown in FIG. 4C, source/drain regions 218 are formed in the recesses 406 in the device region 202 of the semiconductor device 200 over the substrate 204. The deposition tool 102 forms the source/drain regions 218 by an epitaxial operation, in which layers of the epitaxial material are deposited in the recesses 406 such that the layers of p-type source/drain regions and/or layers of n-type source/drain regions are formed by epitaxial growth in a particular crystalline orientation. The source/drain regions 218 are included between the dummy gate structures 210 and at least partially below and/or lower than the dummy gate structures 210. Moreover, the source/drain regions 218 at least partially extend above the top surface of the fin structures 206.

The material (e.g., silicon (Si), gallium (Ga), or another type of semiconductor material) that is used to form the source/drain regions 218 may be doped with a p-type dopant (e.g., a type of dopant that includes electron acceptor atoms that create holes in the material), with an n-type dopant (e.g., a type of dopant that includes electron donor atoms that create mobile electrons in the material), and/or with another type of dopant. The material may be doped by adding impurities (e.g., the p-type dopant, the n-type dopant) to a source gas that is used during the epitaxial operation. Examples of p-type dopants that may be used in the epitaxial operation include boron (B) or germanium (Ge), among other examples. The resulting material of p-type source/drain regions include silicon germanium ($Si_xGe_{1-x}$, where x can be in a range from approximately 0 to approximately 100) or another type of p-doped semiconductor material. Examples of n-type dopants that may be used in the epitaxial operation include phosphorous (P) or arsenic (As), among other examples. The resulting material of n-type source/drain regions include silicon phosphide ($Si_xP_y$) or another type of n-doped semiconductor material.

As indicated above, FIGS. 4A-4C are provided as an example. Other examples may differ from what is described with regard to FIGS. 4A-4C.

Figure 5A:
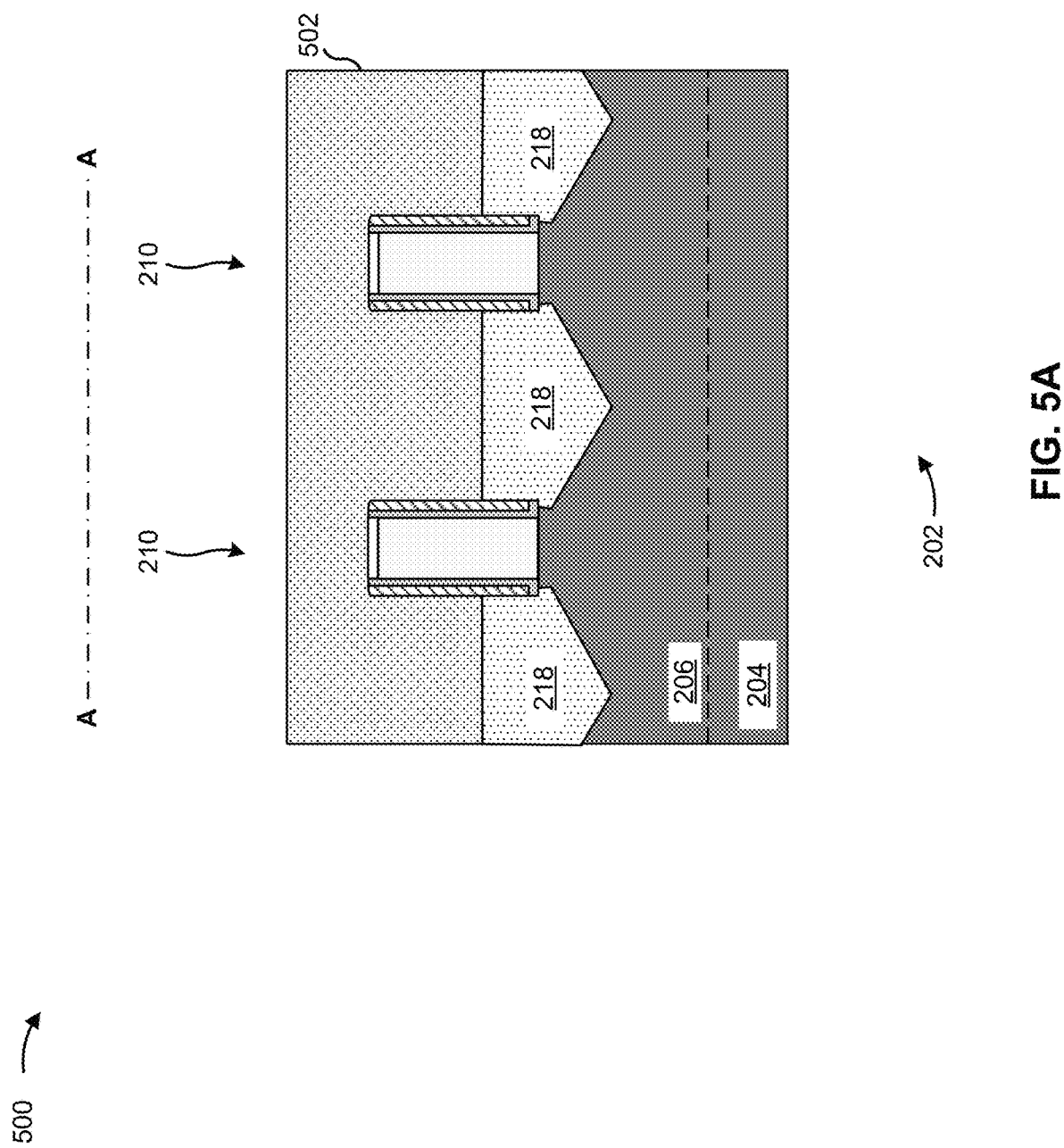
Figure 5B:
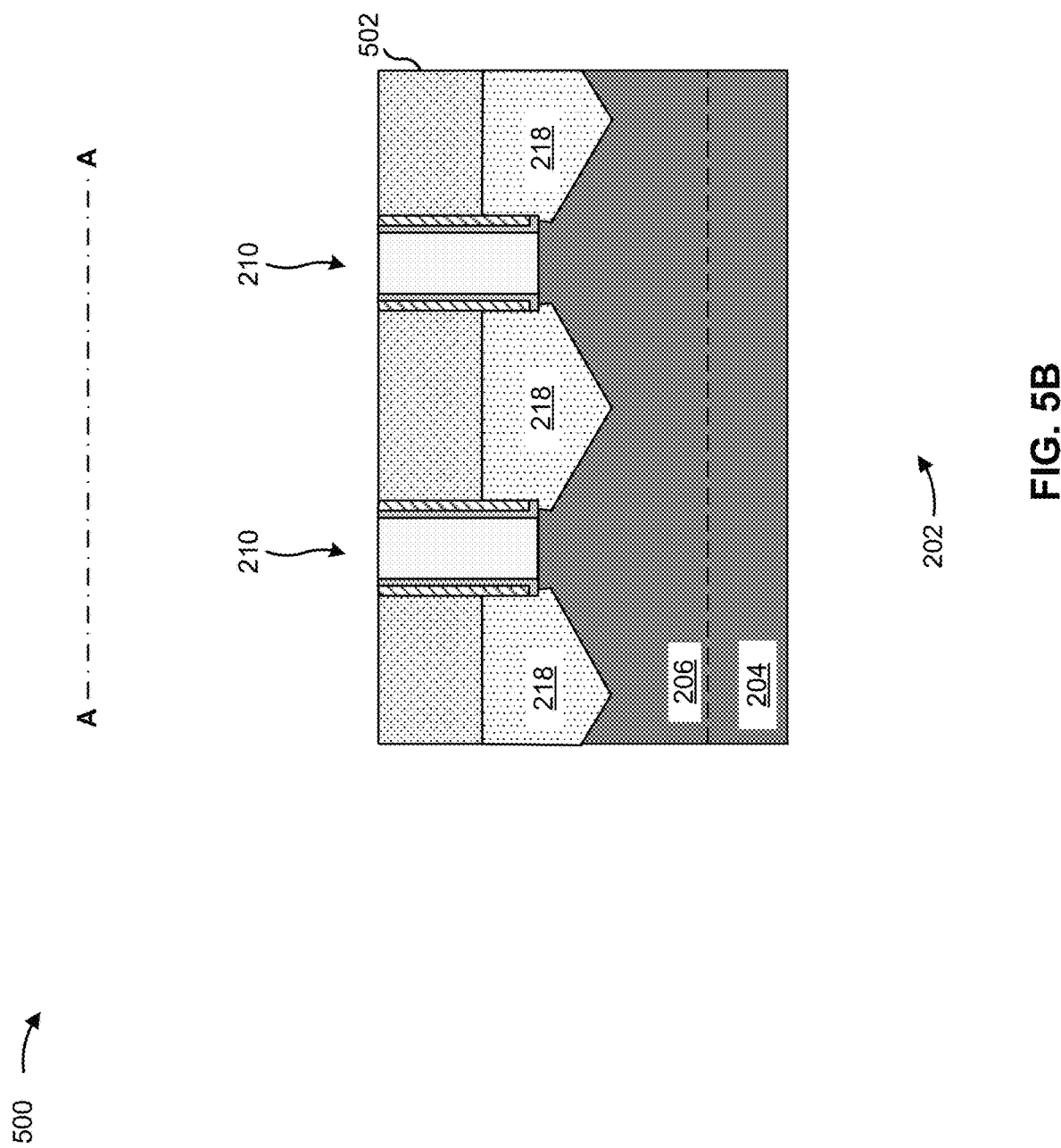
Figure 5C:
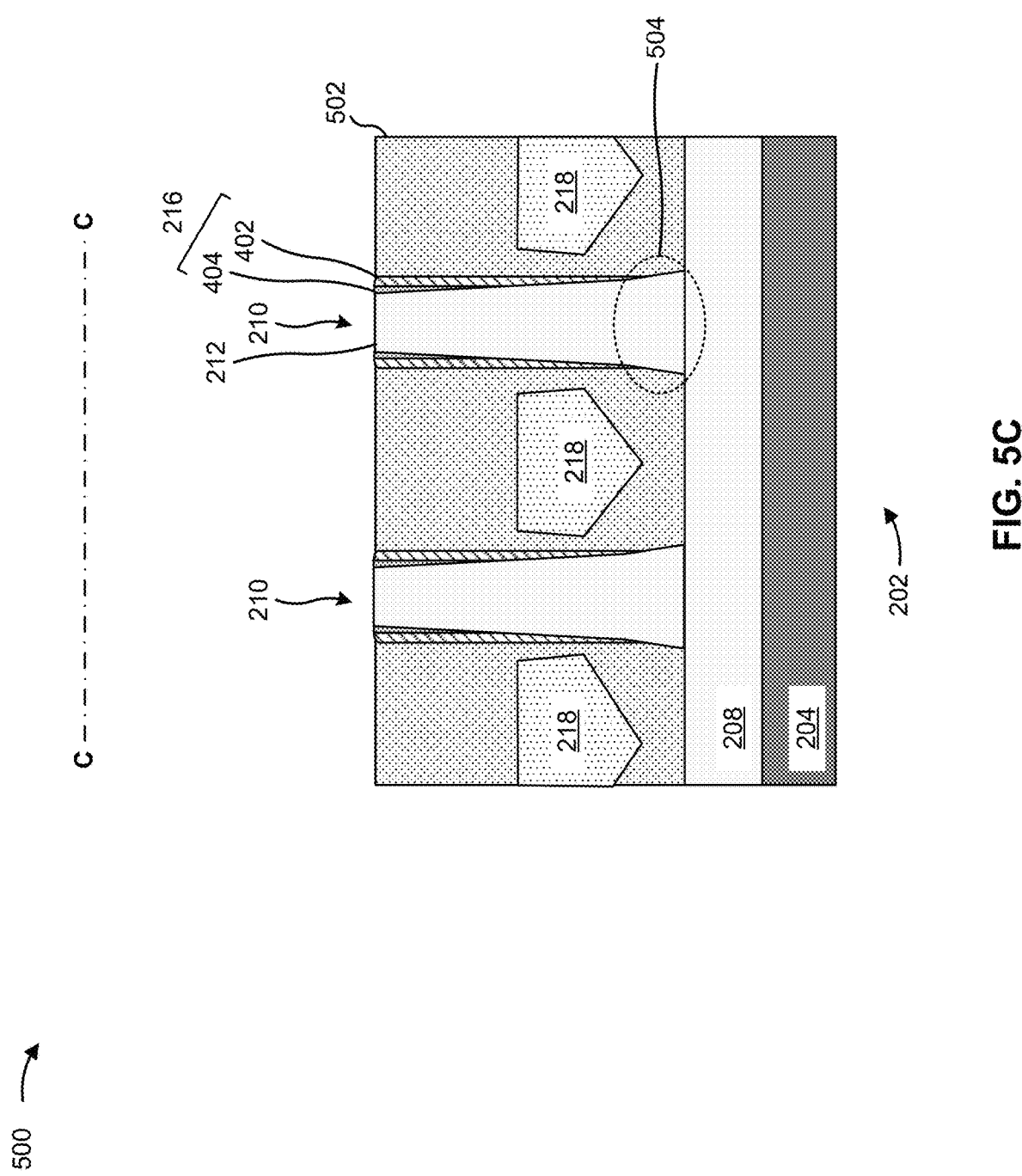

FIGS. 5A-5C are diagrams of an example implementation 500 described herein. The example implementation 500 includes an example process in which an interlayer dielectric (ILD) layer (e.g., an ILD0 layer) is formed in the device region 202 of the semiconductor device 200. FIGS. 5A and 5B are illustrated from the perspective of the cross-sectional plane A-A in FIG. 2 for the device region 202. FIG. 5C is illustrated from the perspective of the cross-sectional plane C-C in FIG. 2 for the device region 202.

As shown in FIG. 5A, an ILD layer 502 is formed (e.g., by the deposition tool 102) in the device region 202 of the semiconductor device 200. The ILD layer 502 fills in the areas between the dummy gate structures 210 over the source/drain regions 218. The ILD layer 502 is formed to permit a gate replacement process to be performed in the device region 202, in which metal gate structures (MGs) are formed to replace the dummy gate structures 210. The ILD layer 502 may be referred to as an ILD zero (ILD0) layer. As further shown in FIG. 5A, the ILD layer 502 may be formed to a height (or thickness) such that the ILD layer 502 covers the dummy gate structures 210.

In some implementations, a contact etch stop layer (CESL) is conformally deposited (e.g., by the deposition tool 102) over the source/drain regions 218, over the dummy gate structures 210, and on the sidewalls of the bulk spacer layers 404 prior to formation of the ILD layer 502. The CESL may provide a mechanism to stop an etch process when forming contacts or vias for the device region 202. The CESL may be formed of a dielectric material having a different etch selectivity from adjacent layers or components. The CESL may include or may be a nitrogen containing material, a silicon containing material, and/or a carbon containing material. Furthermore, the CESL may include or may be silicon nitride ($Si_xN_y$), silicon carbon nitride (SiCN), carbon nitride (CN), silicon oxynitride (SiON), silicon carbon oxide (SiCO), or a combination thereof, among other examples. The CESL may be deposited using a deposition process, such as ALD, CVD, or another deposition technique.

As indicated above, the ILD layer 502 may be formed to a height (or thickness) such that the ILD layer 502 covers the dummy gate structures 210. Accordingly, and as shown in FIG. 5B, a subsequent CMP operation (e.g., performed by the planarization tool 110) is performed to planarize the ILD layer 502 such that the top surfaces of the ILD layer 502 are approximately at a same height as the top surfaces of the dummy gate structures 210. The increases the uniformity of the ILD layer 502. The hard mask layer(s) 214 may be removed from the tops of the dummy gate structures 210 in the CMP operation to provide access to the underlying polysilicon layers 212.

As shown in FIG. 5C, in the cross-sectional plane C-C, the ends of the source/drain regions 218 are surrounded by the ILD layer 502. This is because the ends of the source/drain regions 218 in the cross-sectional plane C-C extend outward past the sidewalls of the fin structure 206. The gate structures extend all the way down to a top surface of an STI region 208 above the substrate 204 in the cross-sectional plane C-C.

As further shown in FIG. 5C, the polysilicon layers 212 may be tapered from a top surface of the polysilicon layers 212 to a bottom surface of the polysilicon layers 212 facing the STI region 208. Moreover, the polysilicon layers 212 may include a flared portion 504 in which the gate spacers 216 (and thus, the seal spacer layers 402 and the bulk spacer layers 404) are non-existent or very thin. In other words, the gate spacers 216 extend along only a portion of the sidewalls of the polysilicon layers 212 and do not extend all the way down to the STI region 208 (or are very thin) due to the flared portions 504 of the polysilicon layers 212. This may be referred to as a "weakened" area or portion of the gate spacers 216. The flared portion 504 may be referred to as a footing of the polysilicon layers 212. The footing of the polysilicon layers 212 may result in insufficient space for formation of the gate spacers 216 in the flared portion 504, resulting in the "weakened" area or portion of the gate spacers 216. The footing of the polysilicon layers 212 (and thus, the flared portion 504) may result due to difficulty in etching the corners of the polysilicon layers 212 near the fin structures 206.

As described below in connection with FIGS. 6A-6N, a two-step etching process may be used to remove a polysilicon layer 212, in preparation for forming a CPODE structure, in a manner that reduces the likelihood of etching into the ILD layer 502 and/or into the source/drain regions 218 in the flared portion 504 where the "weakened" area or portion of the gate spacers 216 is located.

As indicated above, FIGS. 5A-5C are provided as an example. Other examples may differ from what is described with regard to FIGS. 5A-5C.

Figures 6A, 6B:
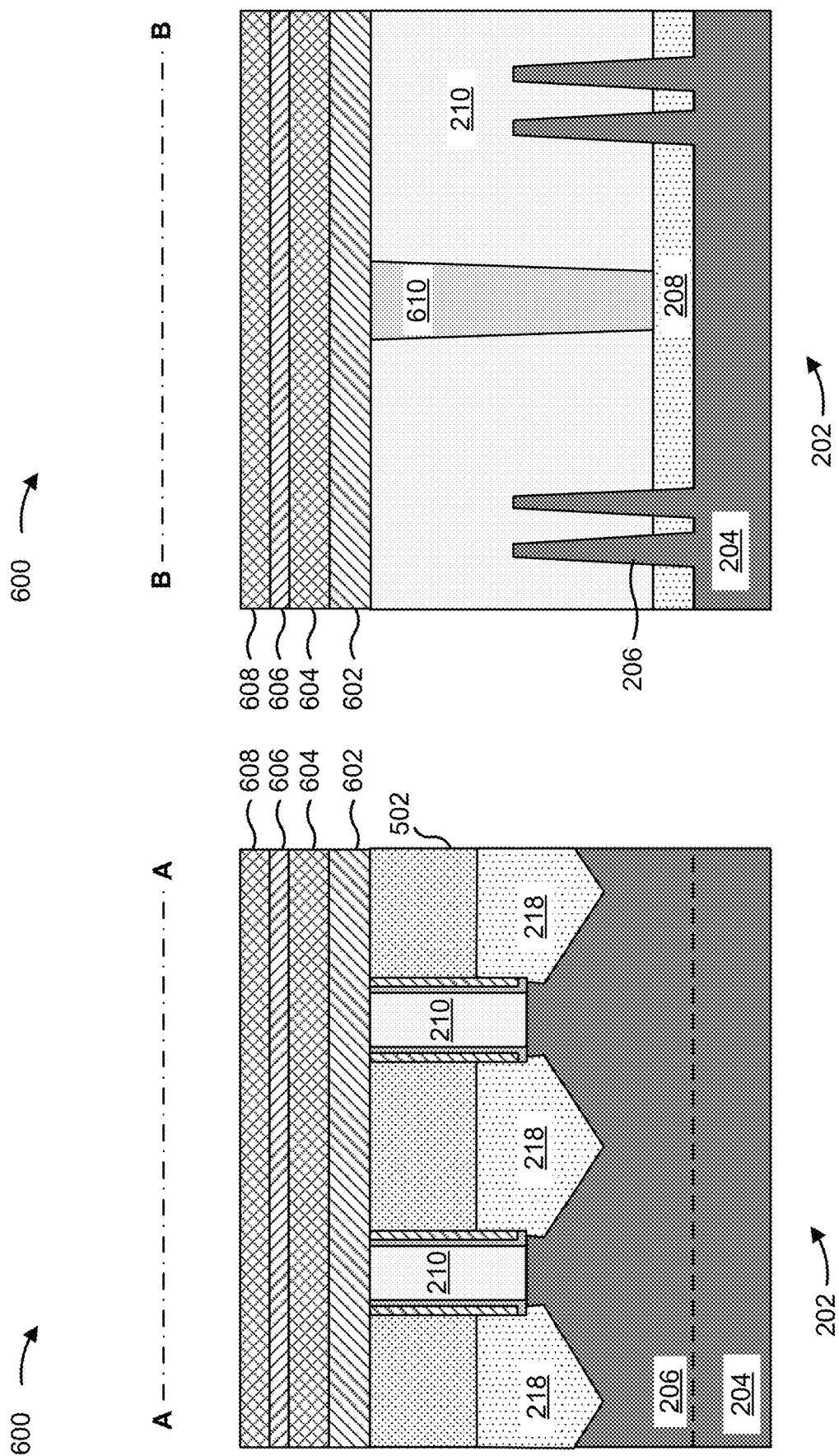
FIGS. 6A-6N are diagrams of an example implementation of forming a continuous polysilicon on oxide definition edge (CPODE) structure described herein.

FIGS. 6A-6N are diagrams of an example implementation 600 described herein. The example implementation 600 includes an example CPODE process, in which a CPODE structure is formed to isolate (e.g., electrically isolate, physically isolate) two or more device regions 202 (e.g., two or more memory cells, two or more active regions) of the semiconductor device 200. FIGS. 6A-6N are illustrated from the perspective of the cross-sectional planes A-A and B-B in FIG. 2 for the device region 202.

FIG. 6A illustrates the device region 202 of the semiconductor device 200 from the perspective of the cross-sectional plane A-A. FIG. 6B illustrates the device region 202 of the semiconductor device 200 from the perspective of the cross-sectional plane B-B. As shown in FIGS. 6A and 6B, a plurality of layers may be formed over and/or on the device region 202 of the semiconductor device 200. For example, the deposition tool 102 may use an ALD technique, a CVD technique, a PVD technique, a spin coating technique, and/or another deposition technique to form the plurality of layers.

The plurality of layers may include a hard mask layer 602 over and/or on the ILD layer 502 and over and/or on the dummy gate structures 210. The hard mask layer 602 may include a silicon nitride ($Si_xN_y$), silicon carbon nitride (SiCN), carbon nitride (CN), silicon oxynitride (SiON), silicon carbon oxide (SiCO), or a combination thereof, among other examples. One or more photoresist layers 604-608 may be formed over and/or on the hard mask layer 602. The one or more photoresist layers 604-608 may include a bottom layer 604, a middle layer 606, and a top layer 608. The top layer 608 may be used to pattern the middle layer 606, the middle layer 606 may be used to pattern the bottom layer 604, and the bottom layer 604 may be used to pattern the hard mask layer 602.

As further shown in FIG. 6B, a cut poly region 610 may be included in the semiconductor device 200. The cut poly region 610 includes a structure that separates a dummy gate structure 210 (and thus, a replacement gate structure) into a plurality of independently controllable gate structures. Thus, a plurality of independently controllable gate structures may be formed by forming a single dummy gate structure 210, separating the dummy date structure 210 into two or more portions using one or more cut poly regions 610, and then replacing the two or more portions of the dummy gate structure 210 with replacement gate structures that are isolated by the one or more cut poly regions 610. In some implementations, the one or more cut poly regions 610 are formed over and/or on hybrid fins (also referred to as h-fins or dummy fins) of the semiconductor device 200.

Figure 6D:
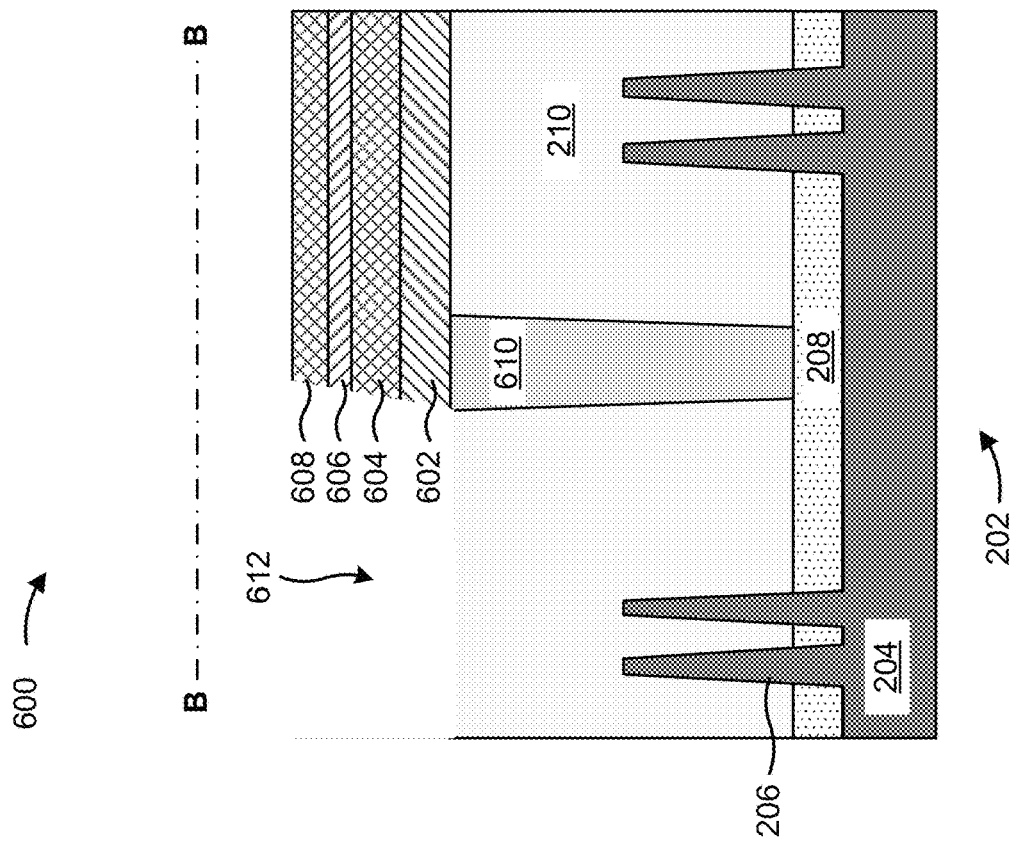
Figure 6C:
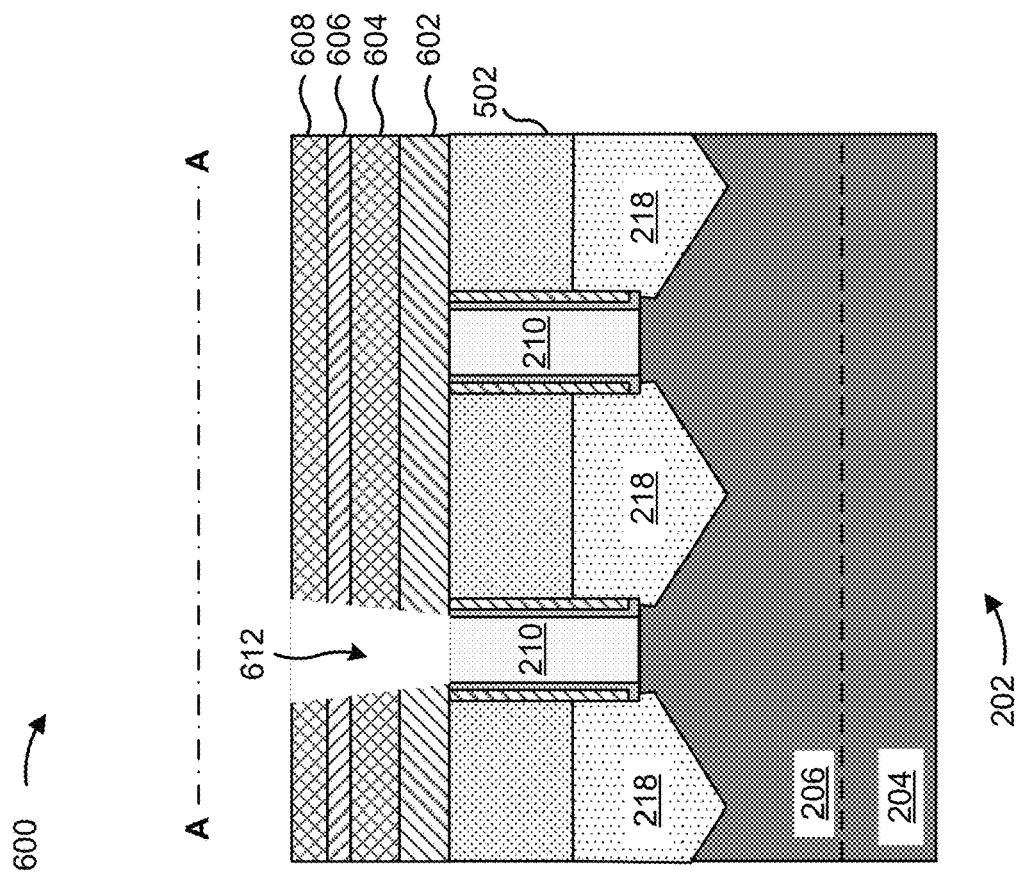

FIG. 6C illustrates the device region 202 of the semiconductor device 200 from the perspective of the cross-sectional plane A-A. FIG. 6D illustrates the device region 202 of the semiconductor device 200 from the perspective of the cross-sectional plane B-B. As shown in FIGS. 6C and 6D, a pattern 612 may be formed in the hard mask layer 602 using the one or more photoresist layers 604-608. This operation may be referred to as a CPODE1 operation. The exposure tool 104 exposes the one or more photoresist layers 604-608 to a radiation source to pattern the photoresist layers 604-608.

The developer tool 106 develops and removes portions of the photoresist layers 604-608 to expose the pattern. The etch tool 108 etches into the hard mask layer 602 to form the pattern 612. In some implementations, the etch operation includes a plasma etch technique, a wet chemical etch technique, and/or another type of etch technique.

Figure 6F:
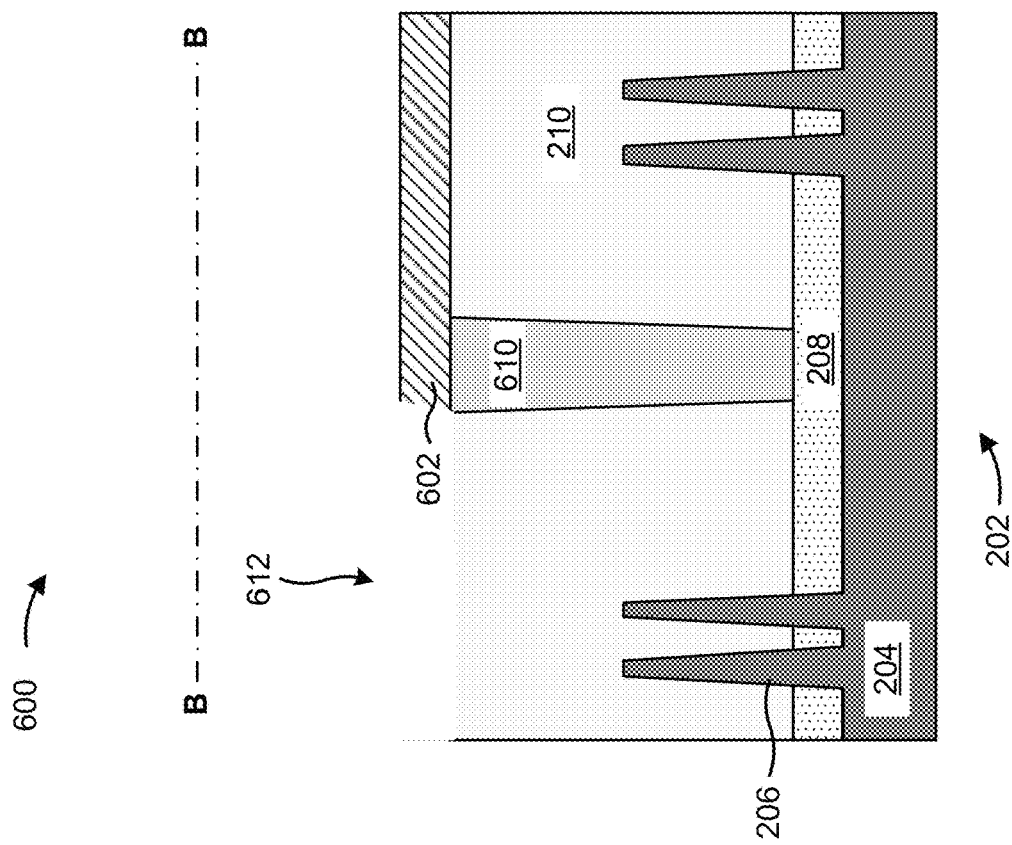
Figure 6E:
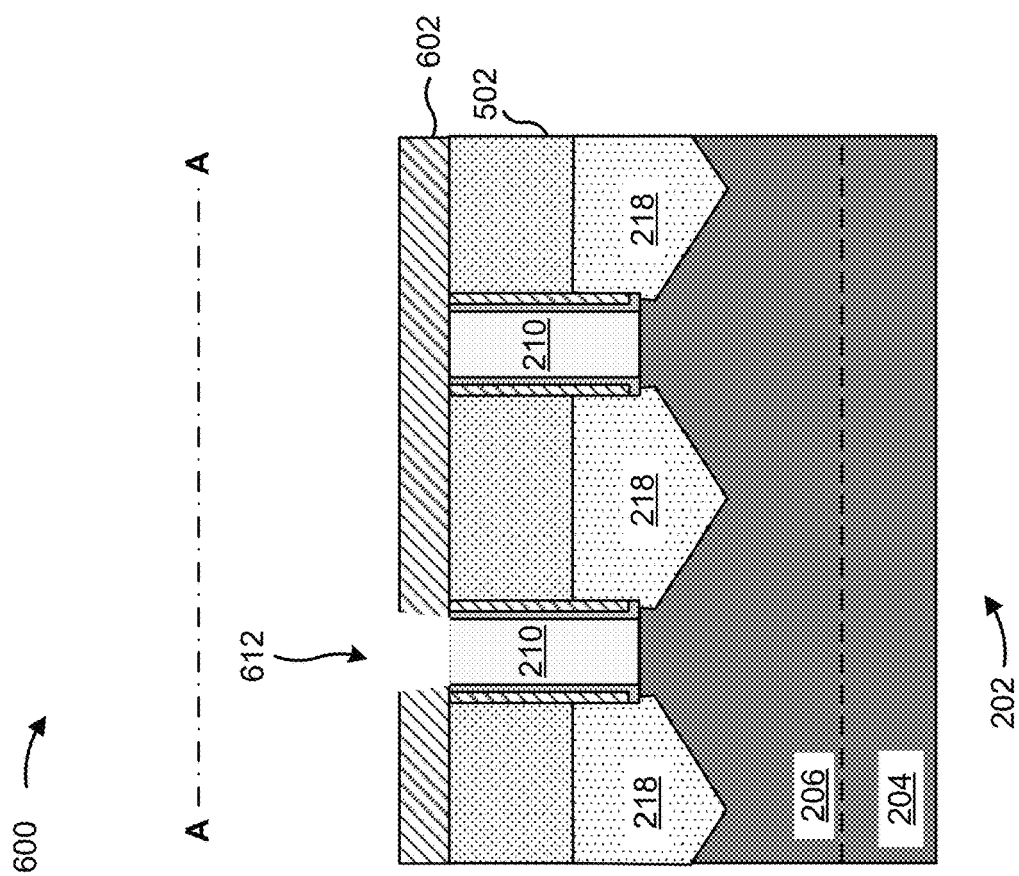

FIG. 6E illustrates the device region 202 of the semiconductor device 200 from the perspective of the cross-sectional plane A-A. FIG. 6F illustrates the device region 202 of the semiconductor device 200 from the perspective of the cross-sectional plane B-B. As shown in FIGS. 6E and 6F, the one or more photoresist layers 604-608 are removed after forming the pattern 612 in the hard mask layer 602. In some implementations, a photoresist removal tool removes the remaining portions of the photoresist layer (e.g., using a chemical stripper, plasma ashing, and/or another technique).

Figures 6G, 6H:
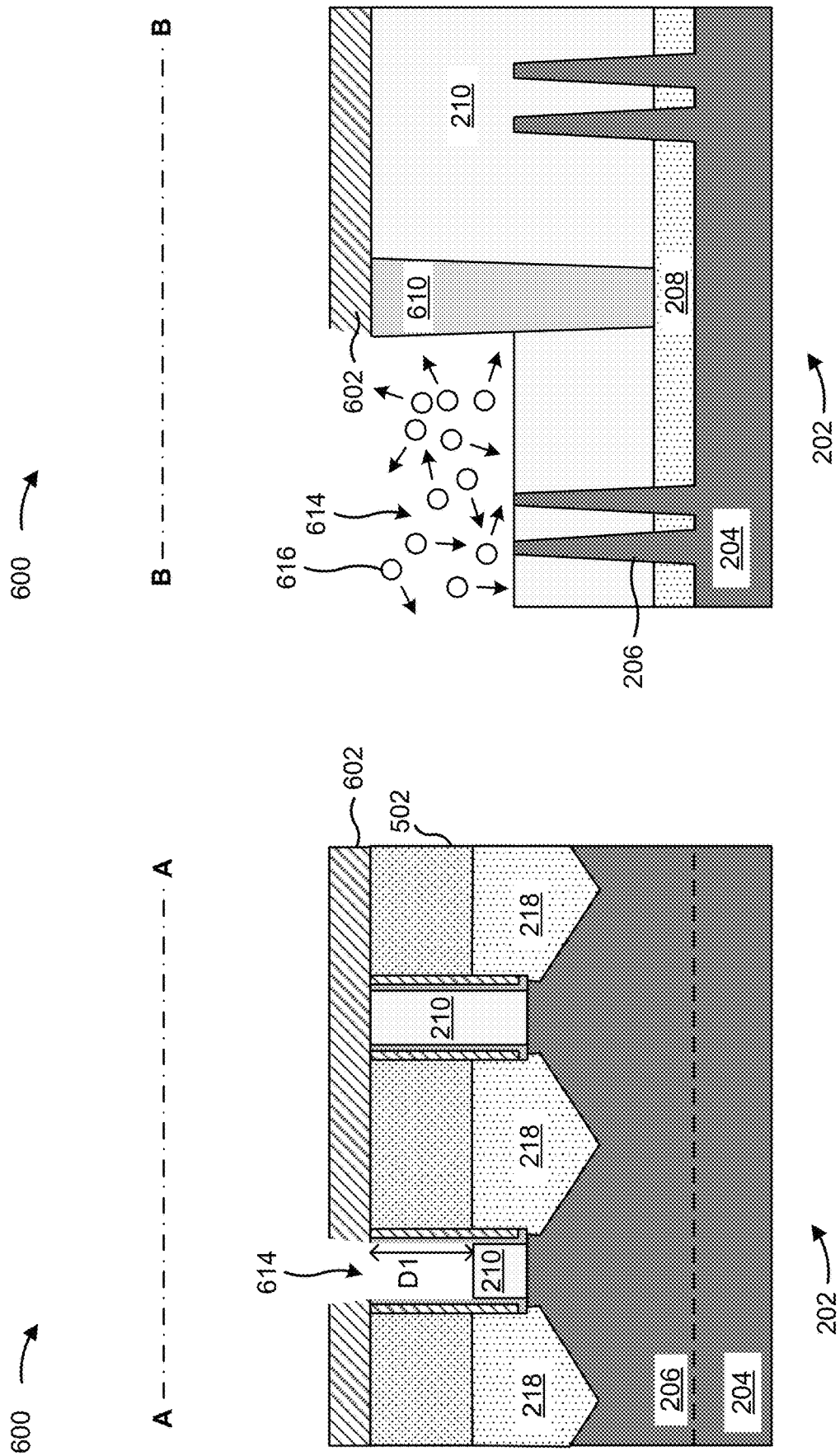

FIG. 6G illustrates the device region 202 of the semiconductor device 200 from the perspective of the cross-sectional plane A-A. FIG. 6H illustrates the device region 202 of the semiconductor device 200 from the perspective of the cross-sectional plane B-B. As shown in FIGS. 6G and 6H, a first etch operation of a two-step etch process is performed to form a recess 614 in which the CPODE structure is to be formed. In the first etch operation, the etch tool 108 uses an isotropic (e.g., non-directional or omnidirectional) etch technique to form the recess 614 to a first (initial) depth (D1) based on the pattern 612 in the hard mask layer 602. The recess 614 is formed into a portion of a dummy gate structure 210. In some implementations, the etch tool 108 etches the polysilicon layer 212 of the dummy gate structure 210 such that the bottom of the recess 614 at the first (initial) depth (D1) corresponds approximately to a height of a top of one or more fin structures 206 in the device region 202, as shown in the example in FIG. 6H. Alternatively, the etch tool 108 may etch the polysilicon layer 212 of the dummy gate structure 210 such that the bottom surface of the recess 614 at the first (initial) depth (D1) is greater than or lesser than the height of the top of the one or more fin structures 206.

The isotropic etch technique may include an isotropic plasma-based etch technique in which a plasma 616 is used to etch the polysilicon layer 212 of the dummy gate structure 210. The ions of the plasma 616 etch the polysilicon layer 212 at multiple angles and/or directions, as shown in the example in FIG. 6H. This provides a greater etch rate relative to an anisotropic etch technique in which ions of a plasma etch in a more directional manner. Etching the recess 614 approximately to the tops of the fin structures 206 reduces processing time of forming the recess 614 while maintaining a sufficiently low likelihood of etching into the adjacent ILD layer(s) 502 and/or into the adjacent source/drain region(s) 218 at the "weakened" areas or portions of the gate spacers 216 at the bottom of the dummy gate structure 210.

To facilitate an isotropic etch in the first etch operation, the etch tool 108 may be operated without the use of a bias voltage. Performing the first etch operation with no bias voltage enables the ions of the plasma to etch material of the polysilicon layer 212 of the dummy gate structure 210 in a non-directional manner. In some implementations, one or more reactants are used in the first etch operation to facilitate etching of the polysilicon layer 212 of the dummy gate structure 210. The reactant(s) may include a nitrogen fluoride ($NF_x$) reactant and/or another reactant.

In some implementations, a time duration of the first etch operation is in a range of approximately 35 seconds to approximately 45 seconds to etch the recess 614 to a sufficient depth while maintaining a low likelihood of etching into the adjacent ILD layer(s) 502 and/or into the adjacent source/drain region(s) 218 at the "weakened" areas or portions of the gate spacers 216 at the bottom of the dummy gate structure 210. However, other values for the range are within the scope of the present disclosure.

FIG. 6I illustrates the device region 202 of the semiconductor device 200 from the perspective of the cross-sectional plane A-A. FIG. 6J illustrates the device region 202 of the semiconductor device 200 from the perspective of the cross-sectional plane B-B. As shown in FIGS. 6I and 6J, a second etch operation of the two-step etch process is performed to form the recess 614 to a second depth (D2). In other words, the second etch operation is performed to increase the depth of the recess 614 from the first (initial) depth (D1) to the second depth (D2). In the second etch operation, the etch tool 108 uses an anisotropic (e.g., directional) etch technique to form the recess 614 to the second depth (D2) based on the pattern 612 in the hard mask layer 602. The second depth (D2) may correspond approximately to a height of a top surface of the STI region 208 below the dummy gate structure 210.

The anisotropic etch technique may include an anisotropic plasma-based etch technique in which a plasma 618 is used to etch the polysilicon layer 212 of the dummy gate structure 210 in a highly direction manner. The ions of the plasma 618 etch the polysilicon layer 212 in a substantially vertical manner, as shown in the example in FIG. 6J. This reduces the likelihood of lateral etching in the second etch operation, which reduces a likelihood of etching into the adjacent ILD layer(s) 502 and/or into the adjacent source/drain region(s) 218 at the "weakened" areas or portions of the gate spacers 216 at the bottom of the dummy gate structure 210.

To facilitate an anisotropic etch in the second etch operation, the etch tool 108 may be operated using a bias voltage to control the directionality of the ions in the plasma 618. Thus, the use of the bias voltage may increase vertical etching in the second etch operation while reducing horizontal or lateral etching in the second etch operation. The bias voltage may be in a range of approximately 400 volts to approximately 600 volts to provide sufficient directional control of the ions in the plasma 618 while minimizing plasma damage during the second etch operation. However, other values for the range are within the scope of the present disclosure.

In some implementations, one or more reactants are used in the second etch operation to facilitate etching of the polysilicon layer 212 of the dummy gate structure 210. In some implementations, the reactant(s) used in the first etch operation and the reactant(s) used in the second etch operation are different reactant(s). In some implementations, the reactant(s) used in the first etch operation and the reactant(s) used in the second etch operation are the same reactant(s). The reactant(s) used in the second etch operation may include, for example, a hydrobromic acid (HBr) reactant, an oxygen ($O_2$) reactant, and/or another reactant.

The highly direction manner of the anisotropic etch technique used in the second etch operation may provide a lesser etch rate relative to the etch rate of the isotropic etch technique used in the first etch operation. Accordingly, the time duration of the second etch operation may be greater relative to the time duration of the first etch operation. Moreover, the thickness of the portion of the polysilicon layer 212 of the dummy gate structure 210 removed in the first etch operation is greater relative to a thickness of the portion of the polysilicon layer 212 of the dummy gate structure 210 removed in the second etch operation. In some implementations, a time duration of the second etch operation is in a range of approximately 45 seconds to approximately 50 seconds to etch the recess 614 to the top surface of the STI region 208. However, other values for the range are within the scope of the present disclosure. In some implementations, a ratio of the time duration of the first etch operation to the time duration of the second etch operation is in a range of approximately 7:10 to approximately 1:1 to reduces processing time of forming the recess 614 while maintaining a sufficiently low likelihood of etching into the adjacent ILD layer(s) 502 and/or into the adjacent source/drain region(s) 218 at the "weakened" areas or portions of the gate spacers 216 at the bottom of the dummy gate structure 210. However, other values for the range are within the scope of the present disclosure.

The operations described above in connection with FIGS. 6A-6G may be referred to as a CPODE2 process. In some implementations, a cleaning operation may be performed after the second (anisotropic) etch operation to remove residual oxides and/or other residual material from the fin structures 206 and from the tops of the STI region(s) 208 in the recess 614. This operation may be referred to as a CPODE3 operation.

Figure 6L:
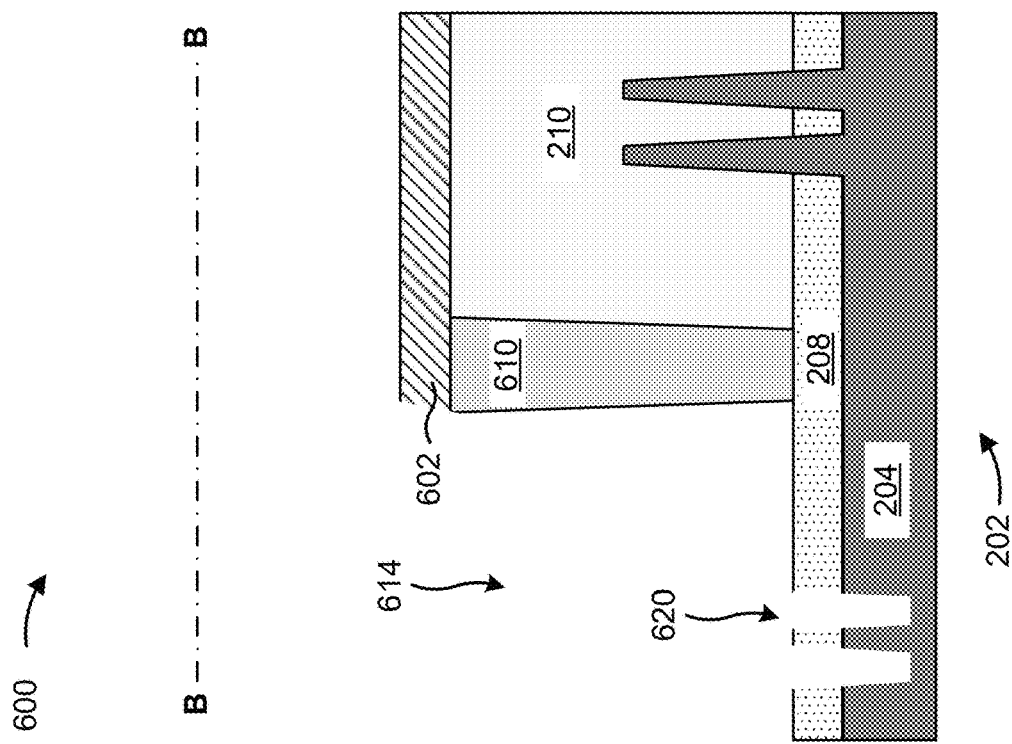
Figure 6K:
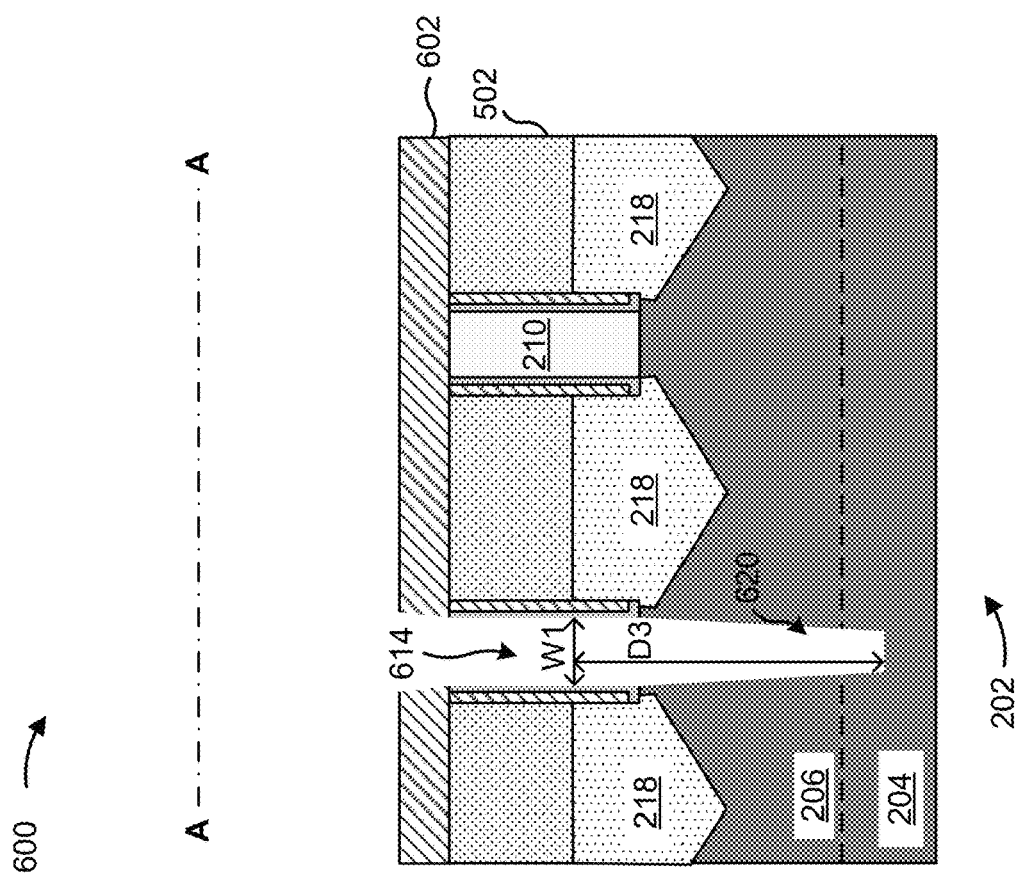

FIG. 6K illustrates the device region 202 of the semiconductor device 200 from the perspective of the cross-sectional plane A-A. FIG. 6L illustrates the device region 202 of the semiconductor device 200 from the perspective of the cross-sectional plane B-B. As shown in FIGS. 6K and 6L, the fin structure(s) 206 that are exposed in the recess 614 are etched to form one or more recesses 620 through the fin structure(s) 206 and into a portion of the substrate 204. Accordingly, the depth of one or more portions of the recess 614 may be further extended or increased by removing or etching the fin structure(s) 206 that are exposed in the recess 614 after the recess 614 is formed to the second depth (D2). This operation may be referred to as a CPODE4 operation.

As further shown in FIG. 6K, the source/drain regions 218 are not exposed through the recess 614. In other words, the material of the fin structure 206 protects the source/drain regions 218 from being exposed through the recess 614. This prevents (or reduces the likelihood of) damage to the source/drain regions 218 that might otherwise occur in the etch operation to increase the depth the recess 614. In other words, the material of the fin structure 206 protects the source/drain regions 218 from being etched in the etch operation to increase the depth the recess 614.

The etch tool 108 may etch the fin structure(s) 206 and the portion of the substrate 204 to form the recess(es) 620 to a depth (D3). The depth (D3) may correspond to a depth from a bottom of the recess(es) 620 to a top of the fin structure(s) 206. The depth (D3) may be in a range of approximately 150 nanometers to approximately 180 nanometers to minimize damage to the substrate 204 while enabling a CPODE structure that is to be formed in the recess(es) 620 to provide sufficient isolation. However, other values for the range are within the scope of the present disclosure.

The two-step etch process described above enables the etch tool 108 to form the recess(es) 620 to a moderate width (W1) at the of the recess(es) 620. For example, the two-step etch process described above enables the etch tool 108 to form the recess(es) 620 such that the width (W1) at the top of the recess(es) 620 is in a range of approximately 20 nanometers to approximately 25 nanometers, which may enable the recess(es) 620 to be formed a sufficient depth (D3) the while minimizing damage to the adjacent ILD layer 502. However, other values for the range are within the scope of the present disclosure. The width (W1) may also be referred to as a fin top critical dimension (FTCD). In some implementations, the FTCD is increased during the CPODE4 operation. For example, the FTCD may be increased from being in a range of approximately 13 nanometers to approximately 15 nanometers after the CPODE2 operation, to being in a range of approximately 20 nanometers to approximately 25 nanometers after the CPODE4 operation. However, other values for the ranges are within the scope of the present disclosure.

Forming the recess(es) 620 to the depth (D3) results in the second depth (D2) of the recess 614 being increased to a third depth in the one or more portions of the recess 614 in which the recess(es) 620 are formed. The third depth corresponds to a combination of the first depth (D1) and the depth (D3) (e.g., D1+D3).

FIG. 6M illustrates the device region 202 of the semiconductor device 200 from the perspective of the cross-sectional plane A-A. FIG. 6N illustrates the device region 202 of the semiconductor device 200 from the perspective of the cross-sectional plane B-B. As shown in FIGS. 6M and 6N, the recesses 614 and 620 are filled with an insulating material to form a CPODE structure 622 in the recesses 614 and 620. This operation may be referred to as a CPODE fill (or refill) operation. The insulating material may include a dielectric material, a nitride (e.g., a silicon nitride ($Si_xN_y$) or another nitride), and/or another insulating material. In some implementations, the cut poly region 610 is considered to be part of the CPODE structure 622, and is illustrated as being combined with the CPODE structure 622 in the example in FIG. 6N. However, in other implementations, the cut poly region 610 is a separate structure from the CPODE structure 622. The hard mask layer 602 may be removed before or after formation of the CPODE structure 622. In some implementations, the planarization tool performs a CMP operation to remove the hard mask layer 602.

In some implementations, the CPODE structure 622 isolates (e.g., electrically isolates, physically isolates) the device region 202 from another device region 202 of the semiconductor device 200. In some implementations, the CPODE structure 622 isolates (e.g., electrically isolates, physically isolates) one or more transistors in device region 202 from one or more other transistors in the device region 202. In some implementations, the CPODE structure 622 isolates (e.g., electrically isolates, physically isolates) one or more active regions in device region 202 from one or more other active regions in the device region 202. In some implementations, the CPODE structure 622 isolates (e.g., electrically isolates, physically isolates) one or more memory cells in device region 202 from one or more other memory cells in the device region 202.

As indicated above, the two-step etch process described in connection with FIGS. 6G-6J enable the opening in the recess 620 in the top of the fin structures 206 to be formed to a greater width (W1). This enables the CPODE structure 622 to be formed deeper into the fin structures 206 and/or deeper into the substrate 204. The increased depth enables the CPODE structure 622 to provide increased isolation, which may increase the performance of the transistors in the semiconductor device 200, may increase the performance of the semiconductor device 200, may increase wafer acceptance test yield for the semiconductor device 200, and/or may reduce noise and/or leakage in the semiconductor device 200, among other examples.

As indicated above, FIGS. 6A-6N are provided as an example. Other examples may differ from what is described with regard to FIGS. 6A-6N. In some implementations, the operations described above in connection with FIGS. 6A-6N may be performed to form a plurality of CPODE structures 622 in the semiconductor device 200, and/or to form a plurality of CPODE structures 622 in the device region 202 of the semiconductor device 200.

Figure 7A:
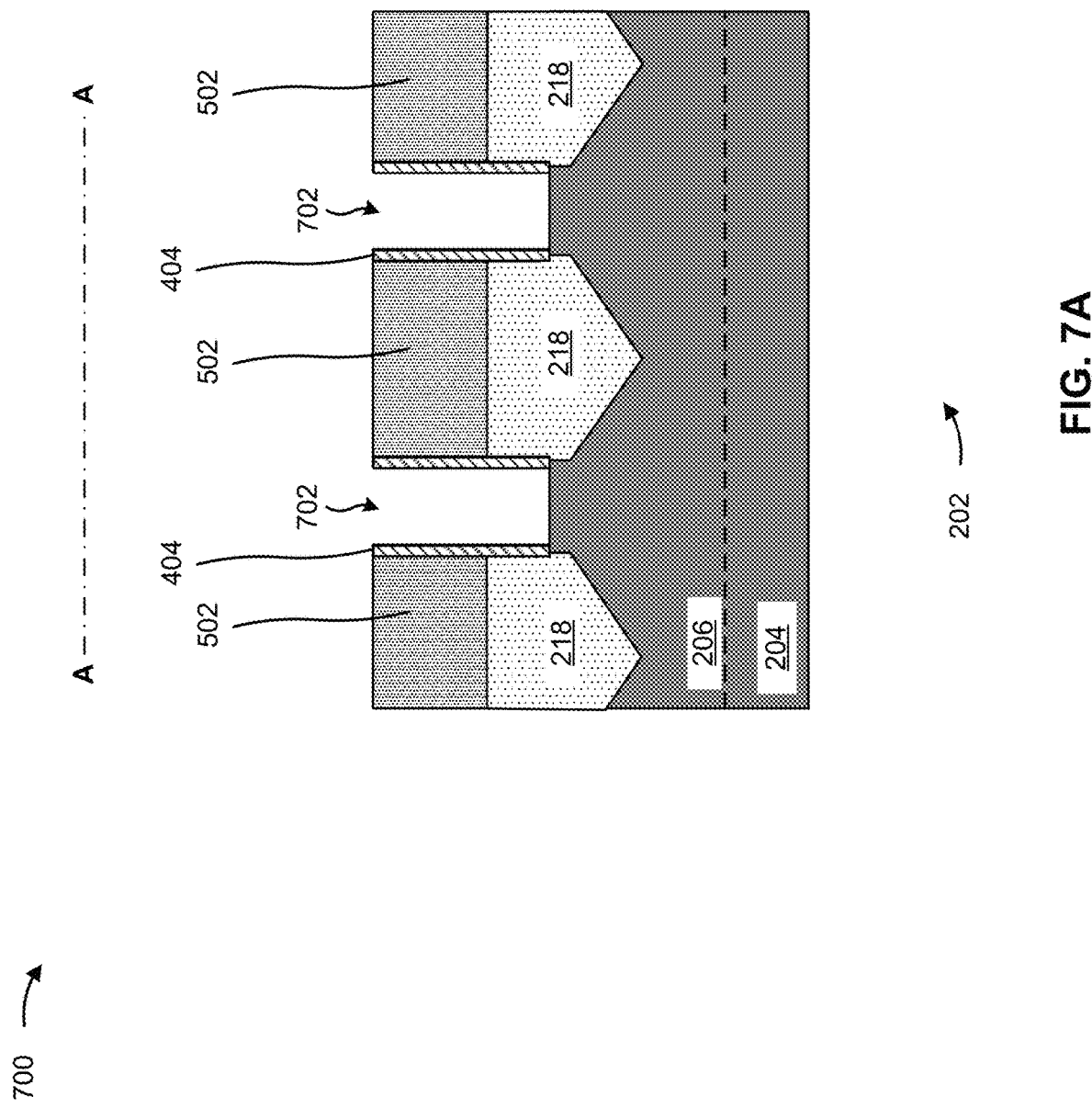
FIGS. 7A, 7B, and 8A-8C are diagrams of examples implementations described herein.
Figure 7B:
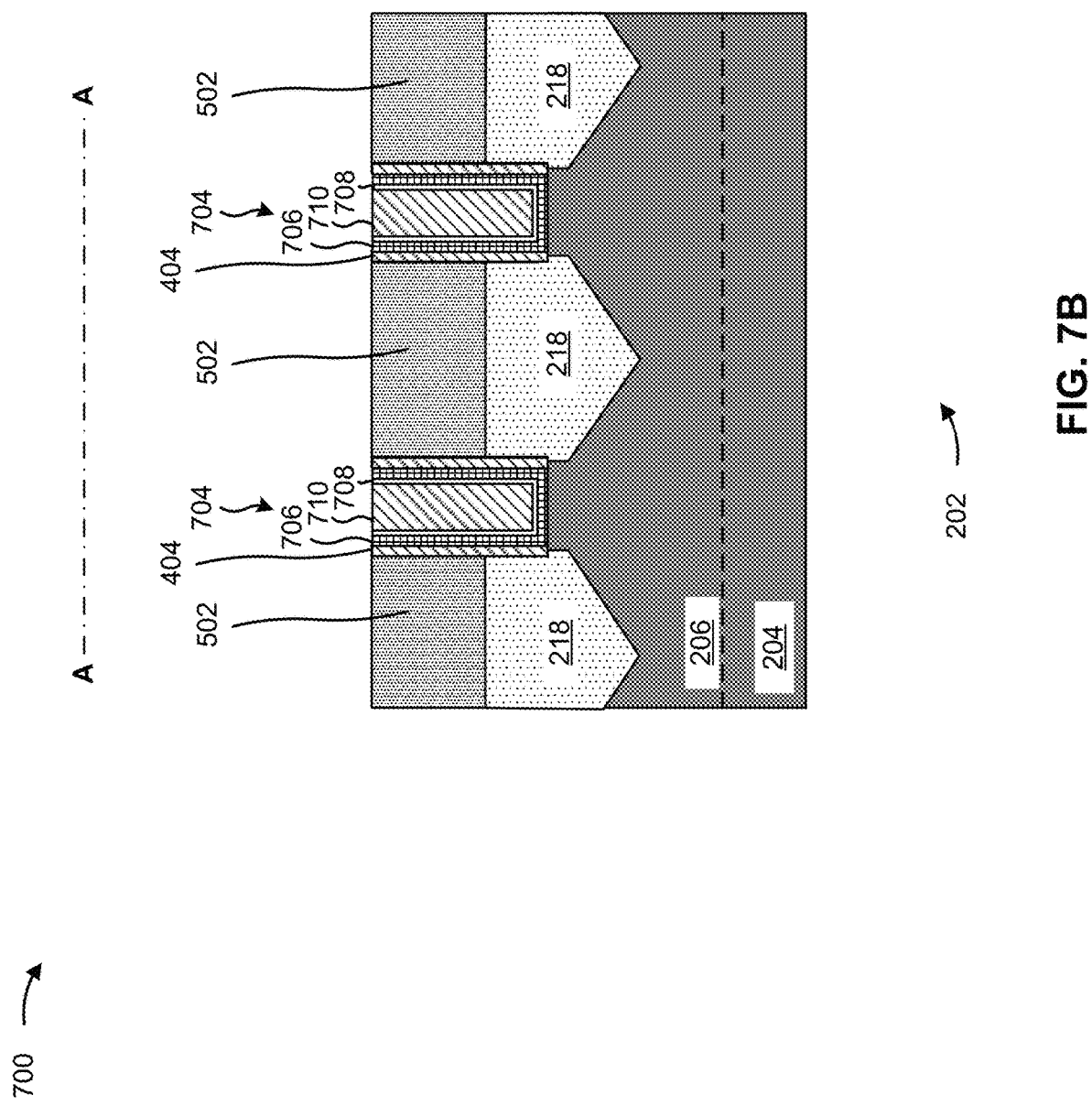

FIGS. 7A and 7B are diagrams of an example implementation 700 described herein. The example implementation 700 includes an example replacement gate (RPG) process, in which the dummy gate structures 210 are replaced with replacement gate structures that include high-k materials and/or metal materials. FIGS. 7A and 7B are illustrated from the perspective of the cross-sectional plane A-A in FIG. 2 for the device region 202. In some implementations, the replacement gate process is performed after the CPODE process described above in connection with FIGS. 6A-6N. In some implementations, the replacement gate structures are formed in a plurality of device regions 202 that are isolated (e.g., electrically isolated, physically isolated) by the CPODE structure 622.

As shown in FIG. 7A, the replacement gate operation is performed (e.g., by one or more of the semiconductor processing tools 102-112) to remove the dummy gate structures 210 from the device region 202. The removal of the dummy gate structures 210 leaves behind openings (or recesses) 702 between the bulk spacer layers 404 and between the source/drain regions 218. The dummy gate structures 210 may be removed in one or more etch operations includes a plasma etch technique, which may include a wet chemical etch technique, and/or another type of etch technique.

As shown in FIG. 7B, the replacement gate operation continues where deposition tool 102 and/or the plating tool 112 forms the gate structures (e.g., replacement gate structures) 704 in the openings 702 between the bulk spacer layers 404 and between the source/drain regions 218. The gate structures 704 may include metal gate structures (MGs) that include one or more metal materials, one or more high-k materials, and/or one or more other types of materials. The gate structures 704 may include an interfacial layer (not shown), a high-k dielectric layer 706, a work function tuning layer 708, and a metal electrode structure 710 formed therein to form a gate structure 704. In some implementations, the gate structures 704 may include other compositions of materials and/or layers.

As indicated above, FIGS. 7A and 7B are provided as an example. Other examples may differ from what is described with regard to FIGS. 7A and 7B.

Figure 8A:
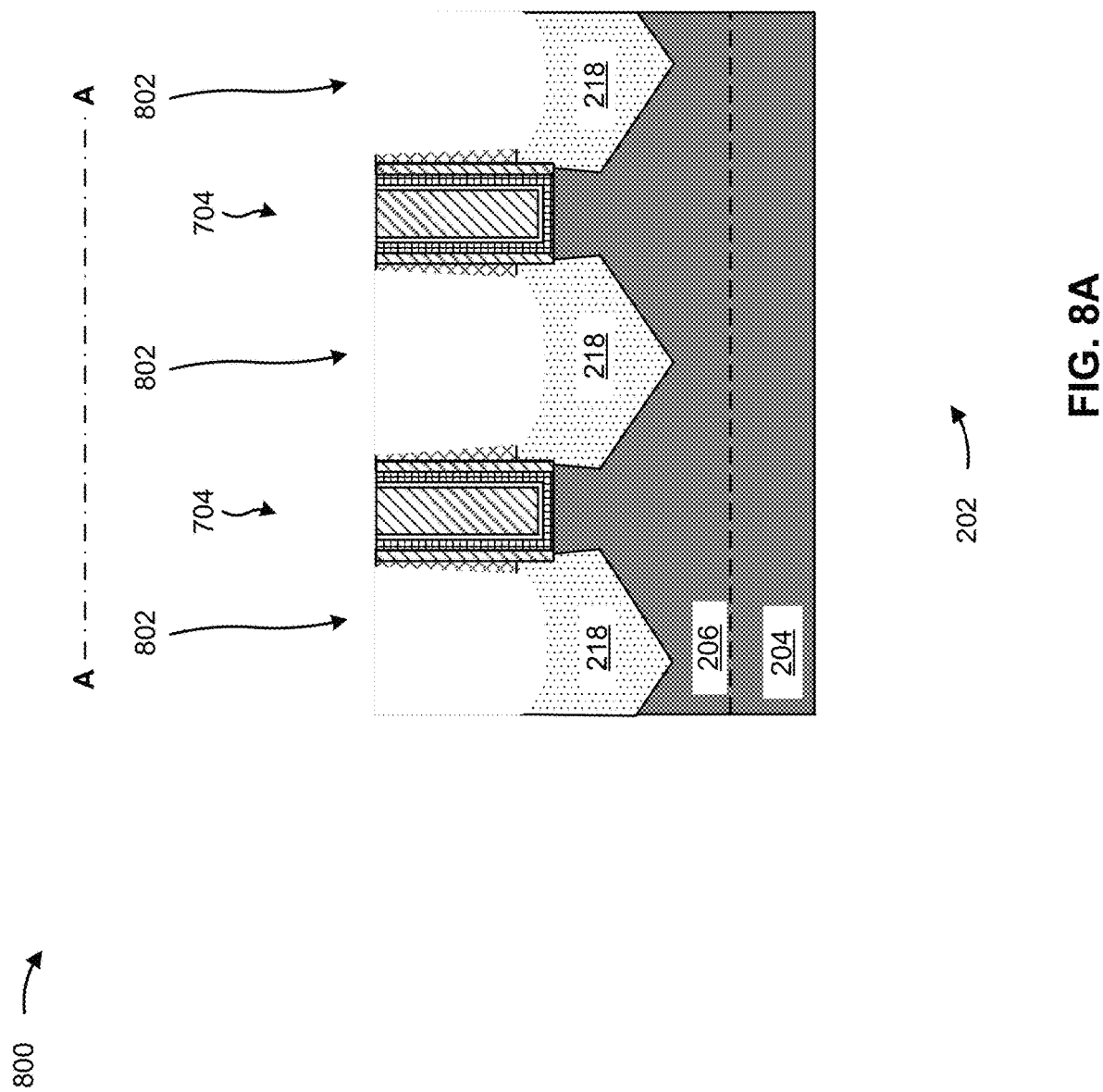
Figure 8B:
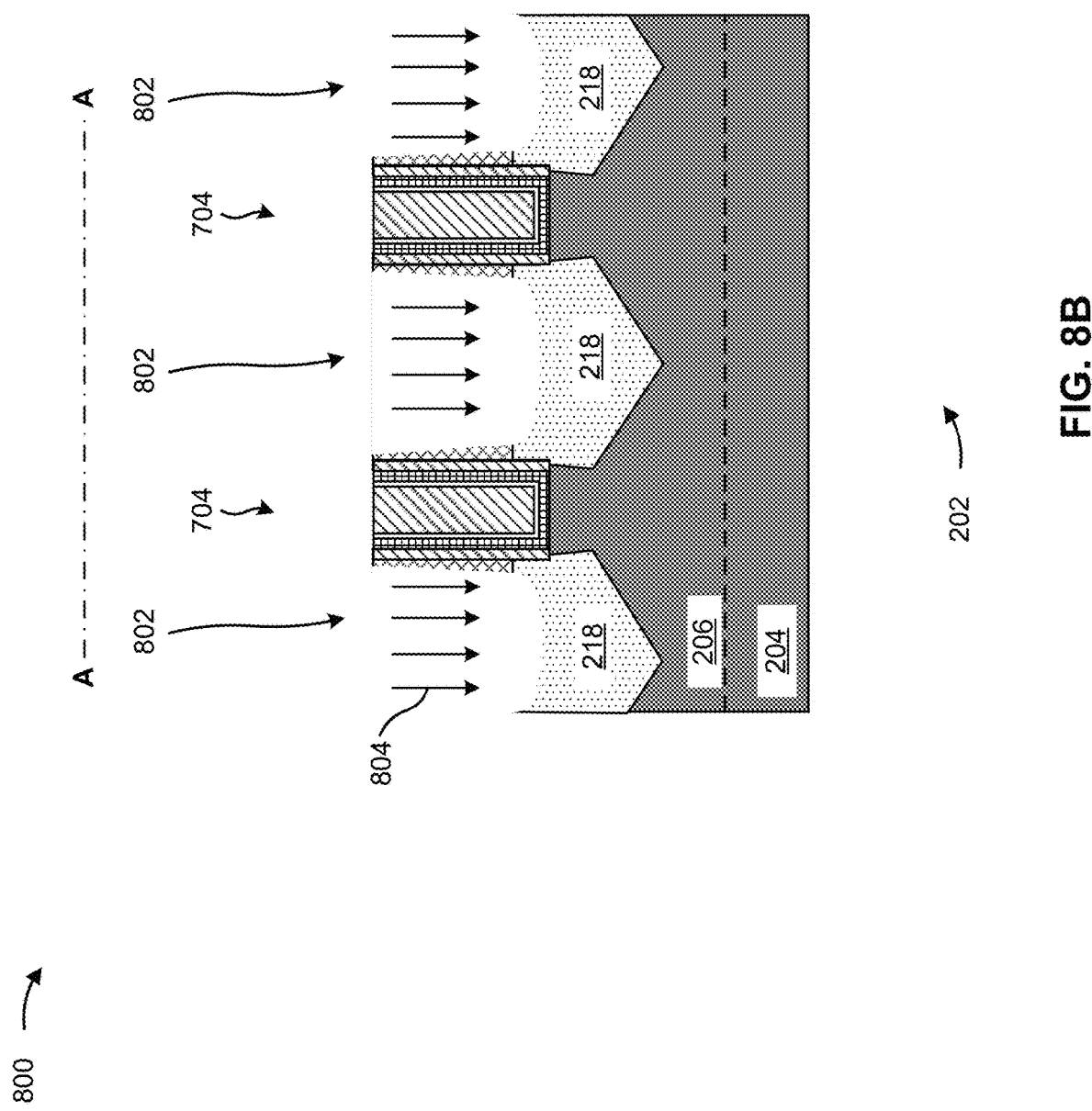
Figure 8C:
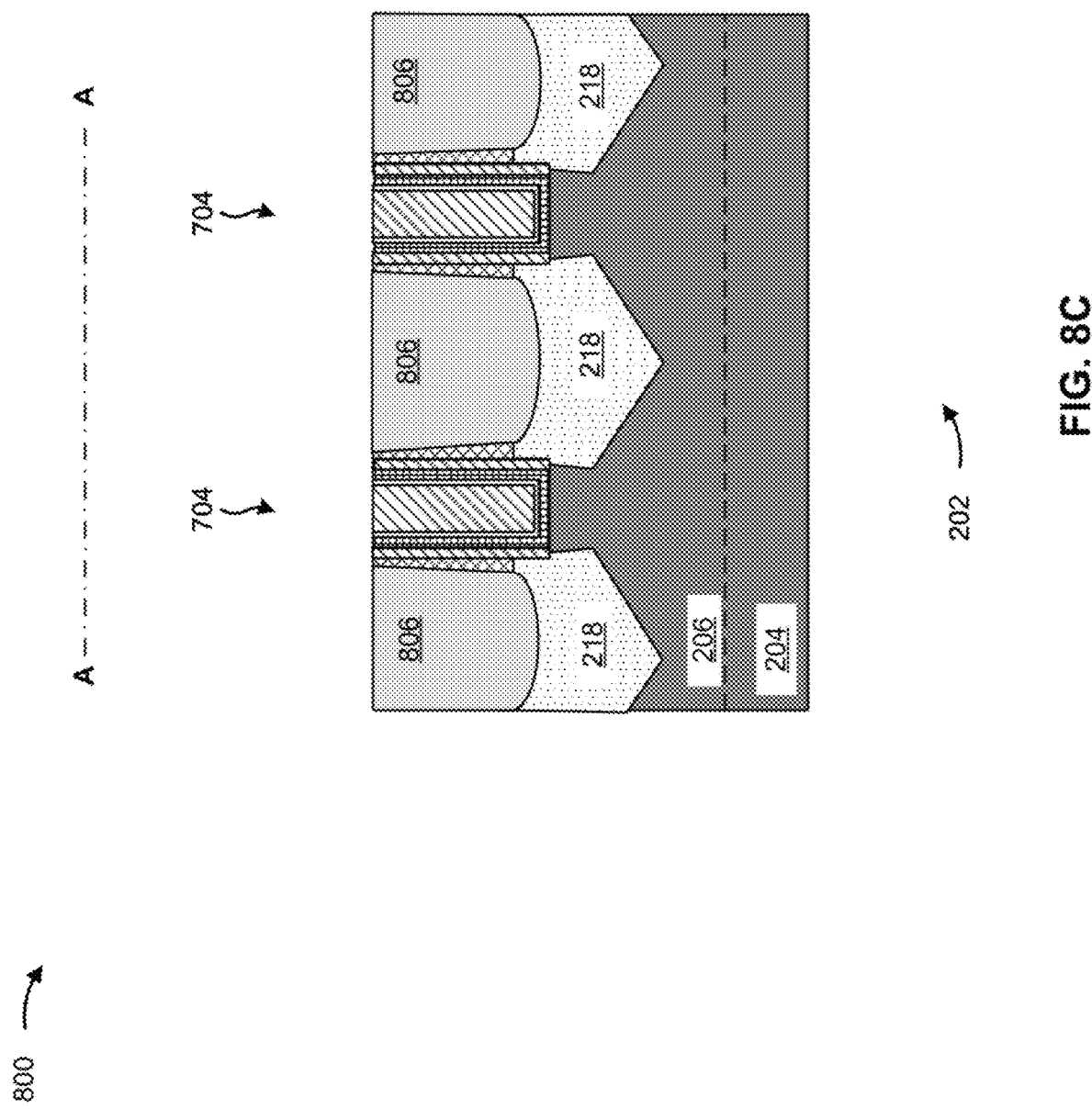

FIGS. 8A-8C are diagrams of an example implementation 800 described herein. The example implementation 800 includes an example of forming conductive structures (e.g., metal gate interconnects, source/drain contacts (MDs)) in the device region 202 of the semiconductor device 200. FIGS. 8A-8C are illustrated from the perspective of the cross-sectional plane A-A in FIG. 2 for the device region 202. In some implementations, the operations described in connection with FIGS. 8A-8C are performed after the CPODE process described above in connection with FIGS. 6A-6N, and after the replacement gate process described above in connection with FIGS. 7A and 7B. In some implementations, the source/drain contacts are formed in a plurality of device regions 202 that are isolated (e.g., electrically isolated, physically isolated) by the CPODE structure 622.

As shown in FIG. 8A, openings (or recesses) 802 are formed through the ILD layers 502 and to the source/drain regions 218. In particular, the portions of the ILD layer 502 between the gate structures 704 in the device region 202 are etched to form the openings 802 between the gate structures 704 and to the source/drain regions 218. In some implementations, the openings 802 are formed in a portion of the source/drain regions 218 such that recesses extend into a portion of the source/drain regions 218. In some implementations, the openings 802 are formed in one or more other layers, such as a CESL, among other examples.

In some implementations, a pattern in a photoresist layer is used to form the openings 802. In these implementations, the deposition tool 102 forms the photoresist layer on the ILD layer 502, and on the gate structures 704. The exposure tool 104 exposes the photoresist layer to a radiation source to pattern the photoresist layer. The developer tool 106 develops and removes portions of the photoresist layer to expose the pattern. The etch tool 108 etches into the ILD layer 502 to form the openings 802. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings 802 based on a pattern.

As shown in FIG. 8B, a pre-clean operation is performed to clean the surfaces in the openings 802. In particular, the semiconductor device 200 may be positioned in a first processing chamber of the deposition tool 102 (e.g., a pre-clean processing chamber), the first processing chamber may be pumped down to an at least partial vacuum (e.g., pressurized to a pressure that is included in a range of approximately 5 Torr to approximately 10 Torr, or to another pressure), and the bottom surfaces and the sidewalls in the openings 802 are cleaned using a plasma-based and/or a chemical-based pre-clean agent 804. The pre-clean operation is performed to clean (e.g., remove) oxides and other contaminants or byproducts from the top surfaces of source/drain regions 218 that may have formed after the formation of the openings 802.

As shown in FIG. 8C, conductive structures 806 are formed in the device region 202. In particular, conductive structures 806 are formed in the openings 802 between the gate structures 704 and over the source/drain regions 218 in the openings 802. The deposition tool 102 and/or the plating tool 112 deposits the conductive structures 806 using a CVD technique, a PVD technique, an ALD technique, an electroplating technique, another deposition technique described above in connection with FIG. 1, and/or a deposition technique other than as described above in connection with FIG. 1. In some implementations, one or more additional layers are formed in the openings 802 prior to formation of the conductive structures 806. As an example, a metal silicide layer (e.g., titanium nitride (TiSi$_x$) or another metal silicide layer) may be formed on the top surfaces of the source/drain regions 218 prior to formation of the conductive structures 806. As another example, one or more barrier layers may be formed on the bottom surfaces and/or on the sidewalls in the openings 802 prior to formation of the conductive structures 806. As another example, one or more adhesion layers may be formed on the bottom surfaces and/or on the sidewalls in the openings 802 prior to formation of the conductive structures 806.

As indicated above, FIGS. 8A-8C are provided as an example. Other examples may differ from what is described with regard to FIGS. 8A-8C.

Figure 9:
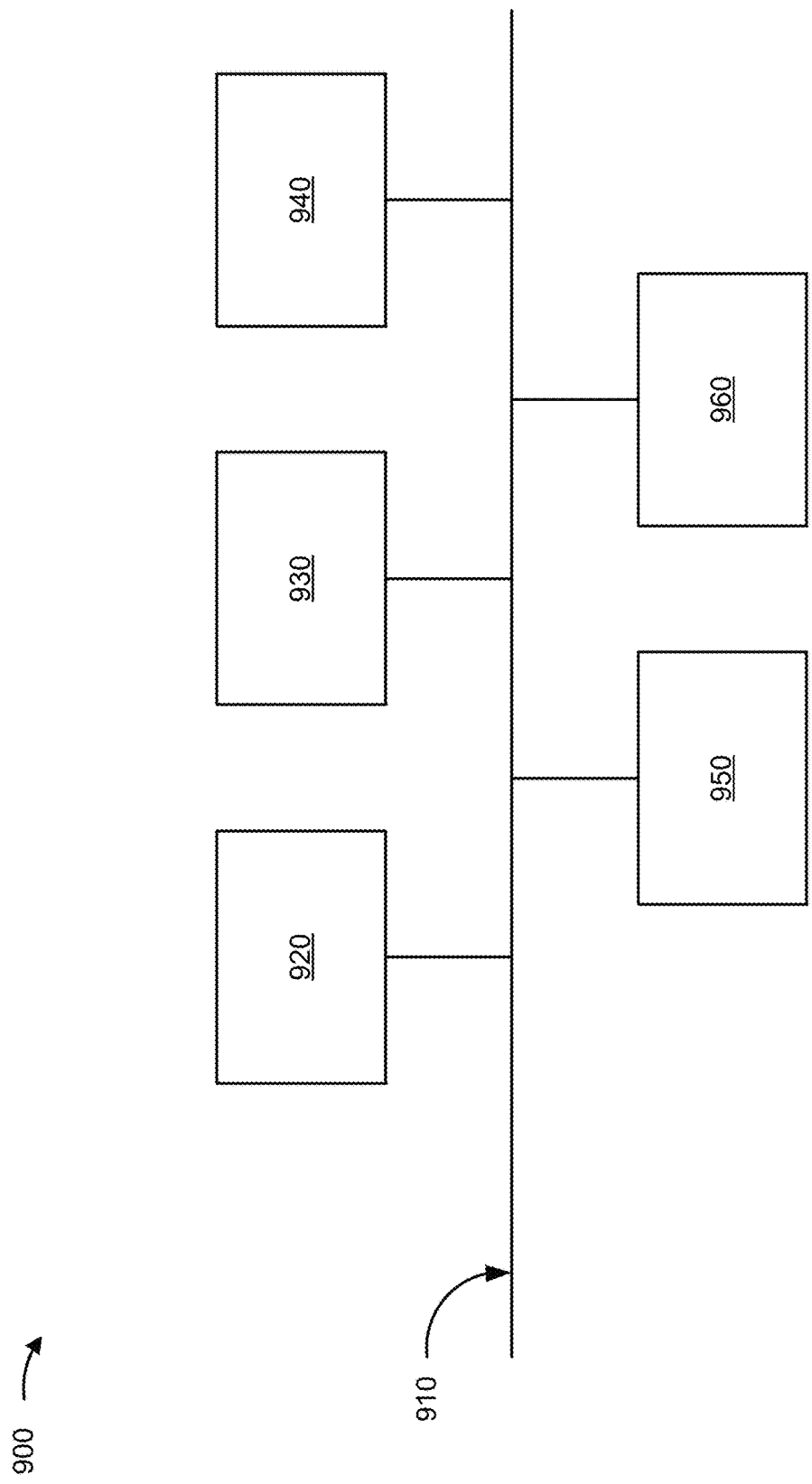
FIG. 9 is a diagram of example components of one or more devices of FIG. 1 described herein.

FIG. 9 is a diagram of example components of a device 900. In some implementations, one or more of the semiconductor processing tools 102-112 and/or the wafer/die transport tool 114 include one or more devices 900 and/or one or more components of device 900. As shown in FIG. 9, device 900 may include a bus 910, a processor 920, a memory 930, an input component 940, an output component 950, and a communication component 960.

Bus 910 includes one or more components that enable wired and/or wireless communication among the components of device 900. Bus 910 may couple together two or more components of FIG. 9, such as via operative coupling, communicative coupling, electronic coupling, and/or electric coupling. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform one or more operations or processes described elsewhere herein.

Memory 930 includes volatile and/or nonvolatile memory. For example, memory 930 may include random access memory (RAM), read only memory (ROM), a hard disk drive, and/or another type of memory (e.g., a flash memory, a magnetic memory, and/or an optical memory). Memory 930 may include internal memory (e.g., RAM, ROM, or a hard disk drive) and/or removable memory (e.g., removable via a universal serial bus connection). Memory 930 may be a non-transitory computer-readable medium. Memory 930 stores information, instructions, and/or software (e.g., one or more software applications) related to the operation of device 900. In some implementations, memory 930 includes one or more memories that are coupled to one or more processors (e.g., processor 920), such as via bus 910.

Input component 940 enables device 900 to receive input, such as user input and/or sensed input. For example, input component 940 may include a touch screen, a keyboard, a keypad, a mouse, a button, a microphone, a switch, a sensor, a global positioning system sensor, an accelerometer, a gyroscope, and/or an actuator. Output component 950 enables device 900 to provide output, such as via a display, a speaker, and/or a light-emitting diode. Communication component 960 enables device 900 to communicate with other devices via a wired connection and/or a wireless connection. For example, communication component 960 may include a receiver, a transmitter, a transceiver, a modem, a network interface card, and/or an antenna.

Device 900 may perform one or more operations or processes described herein. For example, a non-transitory computer-readable medium (e.g., memory 930) may store a set of instructions (e.g., one or more instructions or code) for execution by processor 920. Processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry is used instead of or in combination with the instructions to perform one or more operations or processes described herein. Additionally, or alternatively, processor 920 may be configured to perform one or more operations or processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
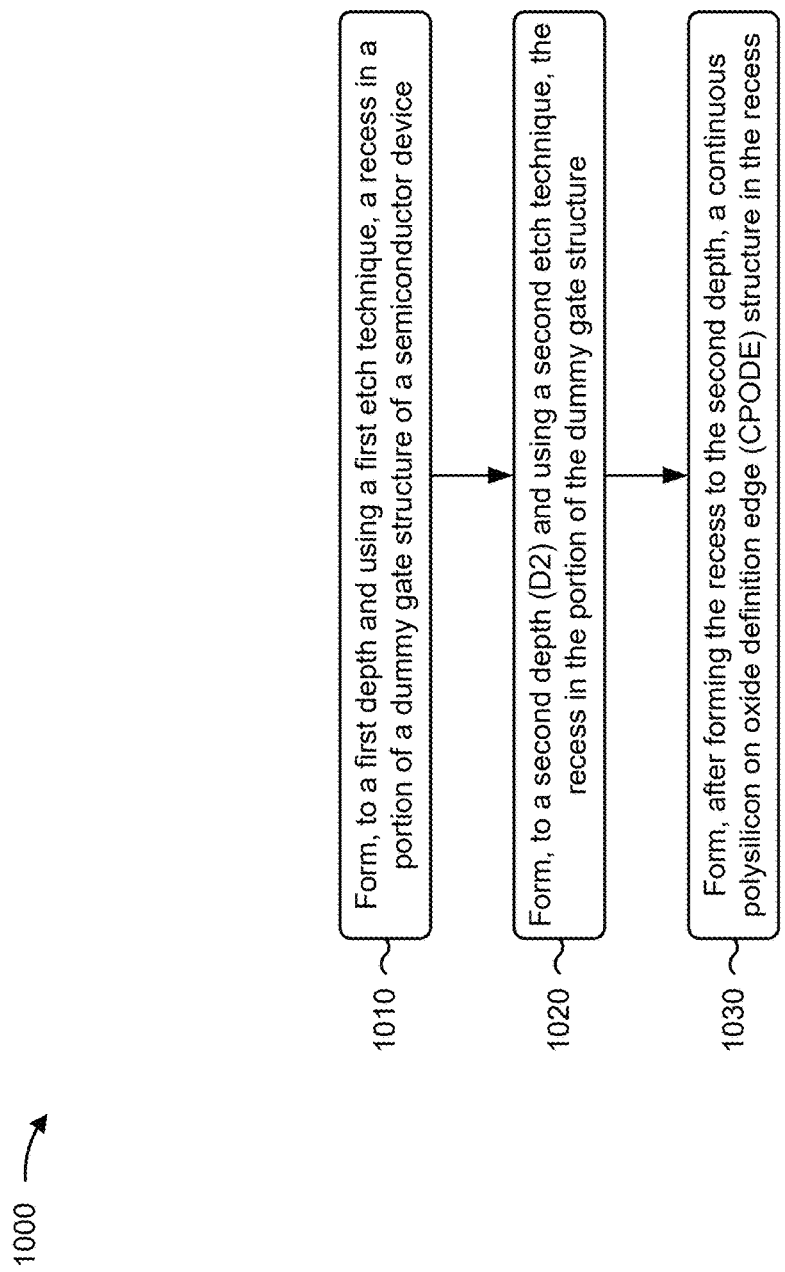
FIGS. 10-12 are flowcharts of example processes relating to forming a CPODE structure described herein.

FIG. 10 is a flowchart of an example process 1000 associated with forming a CPODE structure. In some implementations, one or more process blocks of FIG. 10 are performed by one or more semiconductor processing tools (e.g., one or more of the semiconductor processing tools 102-112). Additionally, or alternatively, one or more process blocks of FIG. 10 may be performed by one or more components of device 900, such as processor 920, memory 930, input component 940, output component 950, and/or communication component 960.

As shown in FIG. 10, process 1000 may include forming, to a first depth and using a first etch technique, a recess in a portion of a dummy gate structure of a semiconductor device (block 1010). For example, one or more of the semiconductor processing tools 102-112 may form, to a first depth (D1) and using a first etch technique, a recess 614 in a portion of a dummy gate structure 210 of a semiconductor device 200, as described above.

As further shown in FIG. 10, process 1000 may include forming, to a second depth and using a second etch technique, the recess in the portion of the dummy gate structure (block 1020). For example, one or more of the semiconductor processing tools 102-112 may form, to a second depth (D2) and using a second etch technique, the recess 614 in the portion of the dummy gate structure 210, as described above.

As further shown in FIG. 10, process 1000 may include forming, after forming the recess to the second depth, a CPODE structure in the recess (block 1030). For example, one or more of the semiconductor processing tools 102-112 may form, after forming the recess 614 to the second depth (D2), a CPODE structure 622 in the recess 614, as described above.

Process 1000 may include additional implementations, such as any single implementation or any combination of implementations described below and/or in connection with one or more other processes described elsewhere herein.

In a first implementation, the first etch technique includes an isotropic etch technique, and wherein the second etch technique includes an anisotropic etch technique. In a second implementation, alone or in combination with the first implementation, the portion of the dummy gate structure 210 is adjacent to at least one ILD layer 502 of the semiconductor device 200, and forming the recess 614 in the portion of the dummy gate structure 210 using the anisotropic etch technique reduces a likelihood of etching into the at least one ILD layer 502 at a bottom of the dummy gate structure 210. In a third implementation, alone or in combination with one or more of the first and second implementations, process 1000 includes forming a hard mask layer 602 over the dummy gate structure 210, forming one or more photoresist layers (e.g., one or more of the layers 604-608) over the hard mask layer 602, forming a pattern 612 in the hard mask layer 602 using the one or more photoresist layers, and forming the recess 614 in the portion of the dummy gate structure 210 based on the pattern 612 in the hard mask layer 602.

In a fourth implementation, alone or in combination with one or more of the first through third implementations, the first etch technique includes a first plasma-based technique in which no bias voltage is used, and the second etch technique includes a second plasma-based etch technique in which a bias voltage is used. In a fifth implementation, alone or in combination with one or more of the first through fourth implementations, a first time duration of a first etch operation, in which the first etch technique is used to form the recess 614 in the portion of the dummy gate structure 210 to the first depth (D1), is lesser relative to a second time duration of a second etch operation in which the second etch technique is used to form the recess 614 in the portion of the dummy gate structure 210 to the second depth (D2). In a sixth implementation, alone or in combination with one or more of the first through fifth implementations, a thickness of the portion of the dummy gate structure 210 that is removed using the first etch technique is greater relative to a thickness of the portion of the dummy gate structure 210 that is removed using the second etch technique.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

Figure 11:
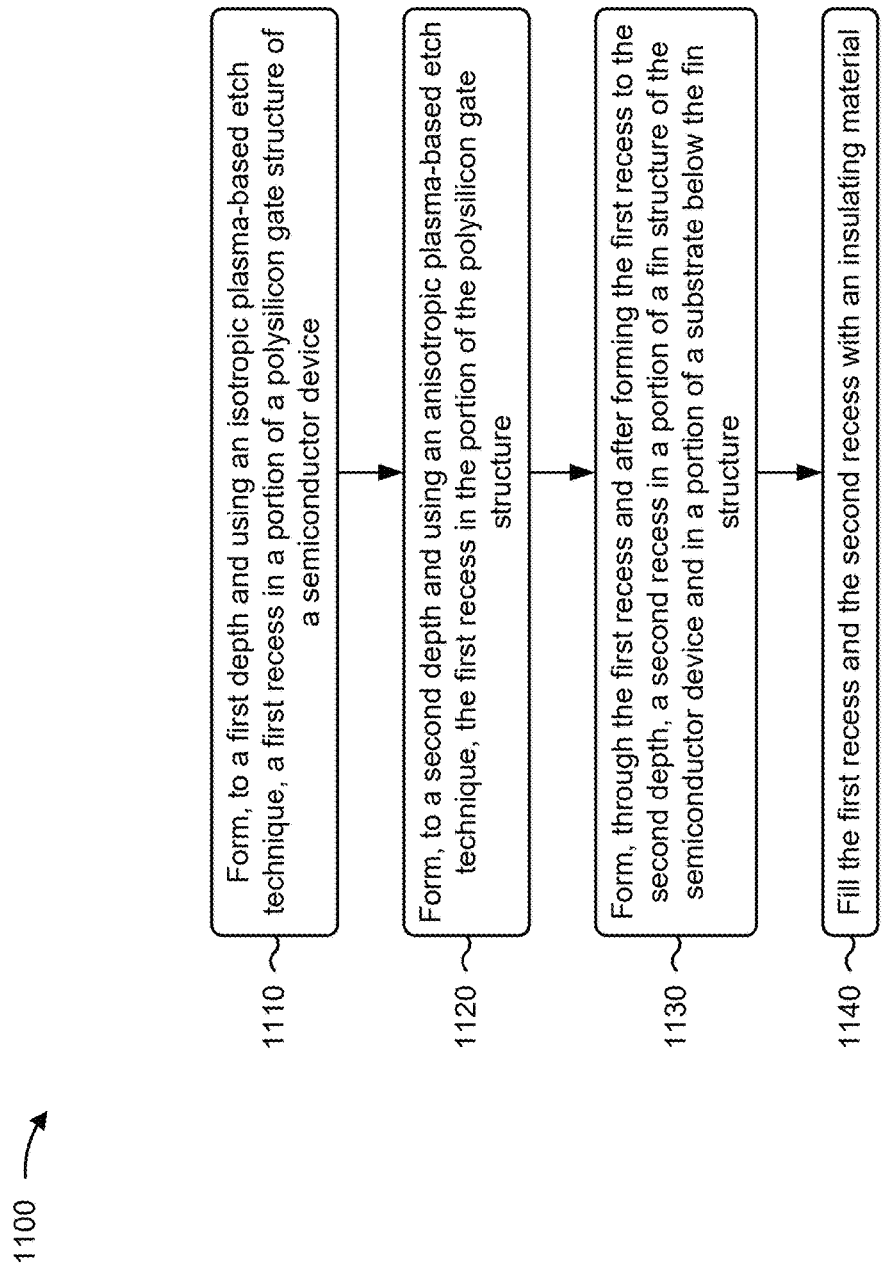

FIG. 11 is a flowchart of an example process 1100 associated with forming a CPODE structure. In some implementations, one or more process blocks of FIG. 11 are performed by one or more semiconductor processing tools (e.g., one or more of the semiconductor processing tools 102-112). Additionally, or alternatively, one or more process blocks of FIG. 11 may be performed by one or more components of device 900, such as processor 920, memory 930, input component 940, output component 950, and/or communication component 960.

As shown in FIG. 11, process 1100 may include forming, to a first depth and using an isotropic plasma-based etch technique, a first recess in a portion of a polysilicon gate structure of a semiconductor device (block 1110). For example, one or more of the semiconductor processing tools 102-112 may form, to a first depth (D1) and using an isotropic plasma-based etch technique, a first recess 614 in a portion of a polysilicon gate structure (e.g., a dummy gate structure 210) of a semiconductor device 200, as described above.

As further shown in FIG. 11, process 1100 may include forming, to a second depth and using an anisotropic plasma-based etch technique, the first recess in the portion of the polysilicon gate structure (block 1120). For example, one or more of the semiconductor processing tools 102-112 may form, to a second depth (D2) and using an anisotropic plasma-based etch technique, the first recess 614 in the portion of the polysilicon gate structure (e.g., a dummy gate structure 210), as described above.

As further shown in FIG. 11, process 1100 may include forming, through the first recess and after forming the first recess to the second depth, a second recess in a portion of a fin structure of the semiconductor device and in a portion of a substrate below the fin structure (block 1130). For example, one or more of the semiconductor processing tools 102-112 may form, through the first recess 614 and after forming the first recess 614 to the second depth (D2), a second recess 620 in a portion of a fin structure 206 of the semiconductor device 200 and in a portion of a substrate 204 below the fin structure 206, as described above.

As further shown in FIG. 11, process 1100 may include filling the first recess and the second recess with an insulating material (block 1140). For example, one or more of the semiconductor processing tools 102-112 may fill the first recess 614 and the second recess 620 with an insulating material, as described above.

Process 1100 may include additional implementations, such as any single implementation or any combination of implementations described below and/or in connection with one or more other processes described elsewhere herein.

In a first implementation, a width (W1) of the second recess 620 at a top of the second recess 620 is greater than a width at a bottom of the second recess 620. In a second implementation, alone or in combination with the first implementation, the portion of the polysilicon gate structure (e.g., a dummy gate structure 210) is adjacent to at least one source/drain region 218 of the semiconductor device 200, and forming the first recess 614 in the portion of the polysilicon gate structure (e.g., a dummy gate structure 210) using the anisotropic plasma-based etch technique reduces a likelihood of etching into the at least one source/drain region 218 at a bottom of the polysilicon gate structure (e.g., a dummy gate structure 210). In a third implementation, alone or in combination with one or more of the first and second implementations, forming the second recess 620 includes forming the second recess 620 to a third depth (D3) that is in a range of approximately 150 nanometers to approximately 180 nanometers.

In a fourth implementation, alone or in combination with one or more of the first through third implementations, forming the first recess 614 to the first depth (D1) using the isotropic plasma-based etch technique includes etching the portion of the polysilicon gate structure (e.g., a dummy gate structure 210) using a nitrogen fluoride ($NF_x$) reactant. In a fifth implementation, alone or in combination with one or more of the first through fourth implementations, forming the first recess 614 to the second depth (D2) using the anisotropic plasma-based etch technique includes etching the portion of the polysilicon gate structure (e.g., a dummy gate structure 210) using a hydrobromic acid (HBr) reactant and an oxygen ($O_2$) reactant. In a sixth implementation, alone or in combination with one or more of the first through fifth implementations, a ratio of a first time duration, of a first etch operation to form the first recess 614 to the first depth (D1) using the isotropic plasma-based etch technique, to a second time duration of a second etch operation to form the first recess 614 to the second depth (D2) using the anisotropic plasma-based etch technique is in a range of approximately 7:10 to approximately 1:1.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

Figure 12:
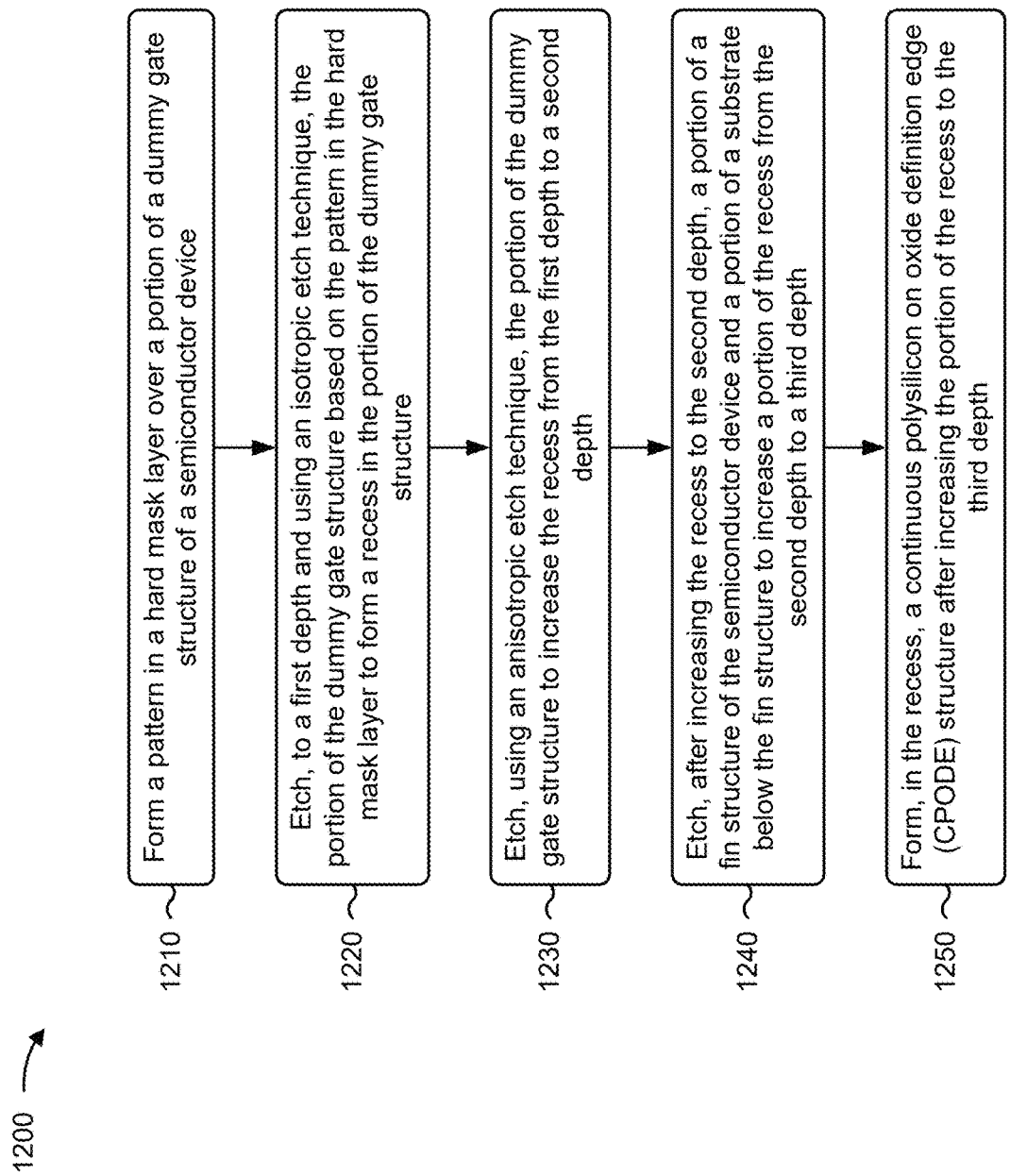

FIG. 12 is a flowchart of an example process 1200 associated with forming a CPODE structure. In some implementations, one or more process blocks of FIG. 12 are performed by one or more semiconductor processing tools (e.g., one or more of the semiconductor processing tools 102-112). Additionally, or alternatively, one or more process blocks of FIG. 12 may be performed by one or more components of device 900, such as processor 920, memory 930, input component 940, output component 950, and/or communication component 960.

As shown in FIG. 12, process 1200 may include forming a pattern in a hard mask layer over a portion of a dummy gate structure of a semiconductor device (block 1210). For example, one or more of the semiconductor processing tools 102-112 may form a pattern 612 in a hard mask layer 602 over a portion of a dummy gate structure 210 of a semiconductor device 200, as described above.

As further shown in FIG. 12, process 1200 may include etching, to a first depth and using an isotropic etch technique, the portion of the dummy gate structure based on the pattern in the hard mask layer to form a recess in the portion of the dummy gate structure (block 1220). For example, one or more of the semiconductor processing tools 102-112 may etch, to a first depth (D1) and using an isotropic etch technique, the portion of the dummy gate structure 210 based on the pattern 612 in the hard mask layer 602 to form a recess 614 in the portion of the dummy gate structure 210, as described above.

As further shown in FIG. 12, process 1200 may include etching, using an anisotropic etch technique, the portion of the dummy gate structure to increase the recess from the first depth to a second depth (block 1230). For example, one or more of the semiconductor processing tools 102-112 may etch, using an anisotropic etch technique, the portion of the dummy gate structure 210 to increase the recess 614 from the first depth (D1) to a second depth (D2), as described above.

As further shown in FIG. 12, process 1200 may include etching, after increasing the recess to the second depth, a portion of a fin structure of the semiconductor device and a portion of a substrate below the fin structure to increase a portion of the recess from the second depth to a third depth (block 1240). For example, one or more of the semiconductor processing tools 102-112 may etch, after increasing the recess 614 to the second depth (D2), a portion of a fin structure 206 of the semiconductor device 200 and a portion of a substrate 204 below the fin structure 206 to increase a portion (e.g., the recess 620) of the recess 614 from the second depth (D2) to a third depth (D1+D3), as described above.

As further shown in FIG. 12, process 1200 may include forming, in the recess, a CPODE structure after increasing the portion of the recess to the third depth (block 1250). For example, one or more of the semiconductor processing tools 102-112 may form, in the recess 614 (including in the recess 620), a CPODE structure 622 after increasing the portion of the recess (e.g., the recess 620) to the third depth, as described above.

Process 1200 may include additional implementations, such as any single implementation or any combination of implementations described below and/or in connection with one or more other processes described elsewhere herein.

In a first implementation, the first depth (D1) corresponds approximately to a height of a top of the fin structure 206. In a second implementation, alone or in combination with the first implementation, the second depth (D2) correspond approximately to a top surface of an STI region 208 adjacent to the fin structure 206, and the height of the top of the fin structure 206 is greater relative to the height of the top surface of the STI region 208. In a third implementation, alone or in combination with one or more of the first and second implementations, a width of the recess 614, at a bottom of the recess 614 after etching the recess 614 to increase the recess 614 from the first depth (D1) to the second depth (D2) and prior to etching the portion of the fin structure 206, is in a range of approximately 13 nanometers to approximately 15 nanometers.

In a fourth implementation, alone or in combination with one or more of the first through third implementations, the portion of the dummy gate structure 210 is adjacent to a source/drain region 218 of the semiconductor device 200 and an ILD layer 502 of the semiconductor device 200, etching the portion of the dummy gate structure 210 to increase the recess 614 from the first depth (D1) to the second depth (D2) using the anisotropic etch technique reduces a likelihood of etching into the source/drain region 218 at a bottom of the dummy gate structure 210, and etching the portion of the dummy gate structure 210 to increase the recess 614 from the first depth (D1) to the second depth (D2) using the anisotropic etch technique reduces a likelihood of etching into the ILD layer 502 at the bottom of the dummy gate structure 210. In a fifth implementation, alone or in combination with one or more of the first through fourth implementations, the isotropic etch technique and the anisotropic etch technique use different reactants.

Although FIG. 12 shows example blocks of process 1200, in some implementations, process 1200 includes additional blocks, fewer blocks, different blocks, or differently arranged blocks than those depicted in FIG. 12. Additionally, or alternatively, two or more of the blocks of process 1200 may be performed in parallel.

In this way, a two-step etch technique is used in a CPODE recess process to form a recess in which the CPODE structure is to be formed. The two-step process includes performing a first etch operation using an isotropic etch technique, in which a recess in a dummy gate structure is formed to a first depth. Then, a second etch operation is performed using anisotropic etch technique to form the recess to a second depth. The use of the anisotropic etch technique results in a highly directional (e.g., vertical) etch of the dummy gate structure in the second etch operation. The anisotropic etch technique is used to etch the recess at or near the bottom of the dummy gate structure where gate spacers along the dummy gate structure might be weak or non-existent. The highly directional etch provided by the anisotropic etch technique at or near the bottom of the dummy gate structure reduces, minimizes, and/or prevents etching into the adjacent portions of the ILD layer and/or into the source/drain region(s) under the portions of the ILD layer because lateral etching is reduced, minimized, and/or prevented using the anisotropic etch technique. Accordingly, the techniques described herein may increase semiconductor device yield, increase semiconductor device performance, and/or reduce the likelihood of damage to the semiconductor device caused by etching. Moreover, the combination of isotropic etching and anisotropic etching enables the recess to be quickly formed (e.g., by using a relatively fast etch technique such as isotropic etching to etch the recess to an initial depth) while (e.g., by using anisotropic etching to etch the remaining depth of the recess) reducing, minimizing, and/or preventing etching damage in the CPODE recess process.

As described in greater detail above, some implementations described herein provide a method. The method includes forming, to a first depth and using a first etch technique, a recess in a portion of a dummy gate structure of a semiconductor device. The method includes forming, to a second depth and using a second etch technique, the recess in the portion of the dummy gate structure. The method includes forming, after forming the recess to the second depth, a CPODE structure in the recess.

As described in greater detail above, some implementations described herein provide a method. The method includes forming, to a first depth and using an isotropic plasma-based etch technique, a first recess in a portion of a polysilicon gate structure of a semiconductor device. The method includes forming, to a second depth and using an anisotropic plasma-based etch technique, the first recess in the portion of the polysilicon gate structure. The method includes forming, through the first recess and after forming the first recess to the second depth, a second recess in a portion of a fin structure of the semiconductor device and in a portion of a substrate below the fin structure. The method includes filling the first recess and the second recess with an insulating material.

As described in greater detail above, some implementations described herein provide a method. The method includes forming a pattern in a hard mask layer over a portion of a dummy gate structure of a semiconductor device. The method includes etching, to a first depth and using an isotropic etch technique, the portion of the dummy gate structure based on the pattern in the hard mask layer to form a recess in the portion of the dummy gate structure. The method includes etching, using an anisotropic etch technique, the portion of the dummy gate structure to increase the recess from the first depth to a second depth. The method includes etching, after increasing the recess to the second depth, a portion of a fin structure of the semiconductor device and a portion of a substrate below the fin structure to increase a portion of the recess from the second depth to a third depth. The method includes forming, in the recess, CPODE structure after increasing the portion of the recess to the third depth.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming, to a first depth and using a first etch technique, a recess in a portion of a dummy gate structure of a semiconductor device,
   wherein the first etch technique comprises an isotropic etch technique;
   forming, to a second depth and using a second etch technique, the recess in the portion of the dummy gate structure,
   wherein the second etch technique comprises an anisotropic etch technique; and
   forming, after forming the recess to the second depth, a continuous polysilicon on oxide definition edge (CPODE) structure in the recess.

2. The method of claim 1, wherein the portion of the dummy gate structure is adjacent to at least one interlayer dielectric (ILD) layer of the semiconductor device; and
   wherein forming the recess in the portion of the dummy gate structure using the anisotropic etch technique reduces a likelihood of etching into the at least one ILD layer at a bottom of the dummy gate structure.

3. The method of claim 1, further comprising:
   forming a hard mask layer over the dummy gate structure;
   forming one or more photoresist layers over the hard mask layer;
   forming a pattern in the hard mask layer using the one or more photoresist layers; and forming the recess in the portion of the dummy gate structure based on the pattern in the hard mask layer.

4. The method of claim 1, wherein the first etch technique comprises a first plasma-based technique in which no bias voltage is used; and
wherein the second etch technique comprises a second plasma-based etch technique in which a bias voltage is used.

5. The method of claim 1, wherein a first time duration of a first etch operation, in which the first etch technique is used to form the recess in the portion of the dummy gate structure to the first depth, is lesser relative to a second time duration of a second etch operation in which the second etch technique is used to form the recess in the portion of the dummy gate structure to the second depth.

6. The method of claim 1, wherein a thickness of the portion of the dummy gate structure that is removed using the first etch technique is greater relative to a thickness of the portion of the dummy gate structure that is removed using the second etch technique.

7. The method of claim 1, wherein the isotropic etch technique and the anisotropic etch technique use different reactants.

8. A method, comprising:
forming, to a first depth and using an isotropic plasma-based etch technique, a first recess in a portion of a polysilicon gate structure of a semiconductor device;
forming, to a second depth and using an anisotropic plasma-based etch technique, the first recess in the portion of the polysilicon gate structure;
forming, through the first recess and after forming the first recess to the second depth, a second recess in a portion of a fin structure of the semiconductor device and in a portion of a substrate below the fin structure; and
filling the first recess and the second recess with an insulating material.

9. The method of claim 8, wherein a width of the second recess at a top of the second recess is greater than a width at a bottom of the second recess.

10. The method of claim 8, wherein the portion of the polysilicon gate structure is adjacent to at least one source/drain region of the semiconductor device; and
wherein forming the first recess in the portion of the polysilicon gate structure using the anisotropic plasma-based etch technique reduces a likelihood of etching into the at least one source/drain region at a bottom of the polysilicon gate structure.

11. The method of claim 8, wherein forming the second recess comprises:
forming the second recess to a third depth that is in a range of approximately 150 nanometers to approximately 180 nanometers.

12. The method of claim 8, wherein forming the first recess to the first depth using the isotropic plasma-based etch technique comprises:
etching the portion of the polysilicon gate structure using a nitrogen fluoride ($NF_x$) reactant.

13. The method of claim 12, wherein forming the first recess to the second depth using the anisotropic plasma-based etch technique comprises:

etching the portion of the polysilicon gate structure using a hydrobromic acid (HBr) reactant and an oxygen ($O_2$) reactant.

14. The method of claim 8, wherein a ratio of a first time duration, of a first etch operation to form the first recess to the first depth using the isotropic plasma-based etch technique, to a second time duration of a second etch operation to form the first recess to the second depth using the anisotropic plasma-based etch technique is in a range of approximately 7:10 to approximately 1:1.

15. A method, comprising:
forming a pattern in a hard mask layer over a portion of a dummy gate structure of a semiconductor device;
etching, to a first depth and using an isotropic etch technique, the portion of the dummy gate structure based on the pattern in the hard mask layer to form a recess in the portion of the dummy gate structure;
etching, using an anisotropic etch technique, the portion of the dummy gate structure to increase the recess from the first depth to a second depth;
etching, after increasing the recess to the second depth, a portion of a fin structure of the semiconductor device and a portion of a substrate below the fin structure to increase a portion of the recess from the second depth to a third depth; and
forming, in the recess, a continuous polysilicon on oxide definition edge (CPODE) structure after increasing the portion of the recess to the third depth.

16. The method of claim 15, wherein the first depth corresponds approximately to a height of a top of the fin structure.

17. The method of claim 16, wherein the second depth correspond approximately to a top surface of a shallow trench isolation (STI) region adjacent to the fin structure; and
wherein the height of the top of the fin structure is greater relative to the height of the top surface of the STI region.

18. The method of claim 15, wherein a width of the recess, at a bottom of the recess after etching the recess to increase the recess from the first depth to the second depth and prior to etching the portion of the fin structure, is in a range of approximately 13 nanometers to approximately 15 nanometers.

19. The method of claim 15, wherein the portion of the dummy gate structure is adjacent to a source/drain region of the semiconductor device and an interlayer dielectric (ILD) layer of the semiconductor device;
wherein etching the portion of the dummy gate structure to increase the recess from the first depth to the second depth using the anisotropic etch technique reduces a likelihood of etching into the source/drain region at a bottom of the dummy gate structure; and
wherein etching the portion of the dummy gate structure to increase the recess from the first depth to the second depth using the anisotropic etch technique reduces a likelihood of etching into the ILD layer at the bottom of the dummy gate structure.

20. The method of claim 15, wherein the isotropic etch technique and the anisotropic etch technique use different reactants.

* * * * *